US011982713B2

(12) United States Patent
Yamamoto et al.

(10) Patent No.: US 11,982,713 B2
(45) Date of Patent: May 14, 2024

(54) INFORMATION PROCESSING DEVICE, INFORMATION PROCESSING SYSTEM, INFORMATION PROCESSING METHOD, AND COMPUTER PROGRAM

(71) Applicant: GS Yuasa International Ltd., Kyoto (JP)

(72) Inventors: Wataru Yamamoto, Kyoto (JP); Hitoshi Matsushima, Kyoto (JP); Keita Nakai, Kyoto (JP); Tetsuro Matsumoto, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 304 days.

(21) Appl. No.: 17/605,411

(22) PCT Filed: Apr. 13, 2020

(86) PCT No.: PCT/JP2020/016257
§ 371 (c)(1),
(2) Date: Oct. 21, 2021

(87) PCT Pub. No.: WO2020/218053
PCT Pub. Date: Oct. 29, 2020

(65) Prior Publication Data
US 2022/0229115 A1 Jul. 21, 2022

(30) Foreign Application Priority Data

Apr. 26, 2019 (JP) ................................. 2019-084792

(51) Int. Cl.
*G01R 31/367* (2019.01)
*G01R 31/36* (2020.01)
(Continued)

(52) U.S. Cl.
CPC ....... *G01R 31/367* (2019.01); *G01R 31/3646* (2019.01); *G01R 31/371* (2019.01);
(Continued)

(58) Field of Classification Search
None
See application file for complete search history.

(56) References Cited

U.S. PATENT DOCUMENTS 9,726,763 B2 * 8/2017 Dempsey .......... H01M 10/4221
2011/0295440 A1 12/2011 Noma et al.
(Continued)

FOREIGN PATENT DOCUMENTS

EP 2549351 A1 1/2013
EP 2793344 A1 10/2014
(Continued)

OTHER PUBLICATIONS

International Searching Authority, International Search Report and Written Opinion for International Application No. PCT/JP2020/016257, dated Jun. 23, 2020, (9 pages), Japan Patent Office, Tokyo, Japan.

*Primary Examiner* — Roy Y Yi
(74) *Attorney, Agent, or Firm* — Alston & Bird LLP

(57) ABSTRACT

Provided are an information processing device, an information processing system, an information processing method, and a computer program capable of visually and easily grasping a state of an energy storage device. An information processing device includes: an acquisition unit configured to acquire information including a state of an energy storage device by communication at predetermined time intervals; a storage processing unit configured to store the acquired information in a storage medium in association with information for identifying the energy storage device; a transmission processing unit configured to transmit screen infor-
(Continued)

mation of a state screen including an image of a system including the energy storage device and a graphic indicating the state of the energy storage device to a communication terminal device; and an automatic monitor unit configured to update information of the graphic based on latest information stored in the storage medium and periodically transmit the information of the graphic to the communication terminal device.

10 Claims, 16 Drawing Sheets

(51) Int. Cl.
G01R 31/371 (2019.01)
G01R 31/396 (2019.01)
H01M 10/48 (2006.01)
H04L 67/12 (2022.01)

(52) U.S. Cl.
CPC .......... G01R 31/396 (2019.01); H01M 10/48 (2013.01); H04L 67/12 (2013.01)

(56) References Cited

U.S. PATENT DOCUMENTS

| | | |
|---|---|---|
| 2015/0261242 A1 | 9/2015 | Noma et al. |
| 2015/0372518 A1 | 12/2015 | Toya et al. |
| 2016/0179119 A1 | 6/2016 | Noma et al. |
| 2017/0170668 A1 | 6/2017 | Hayashizaki et al. |
| 2018/0107934 A1 | 4/2018 | Noda et al. |
| 2018/0129236 A1 | 5/2018 | Noma et al. |
| 2020/0068524 A1 | 2/2020 | Noma et al. |
| 2020/0092841 A1 | 3/2020 | Noma et al. |
| 2021/0168757 A1 | 6/2021 | Noma et al. |

FOREIGN PATENT DOCUMENTS

| | | |
|---|---|---|
| JP | 2001-312342 A | 11/2001 |
| JP | 2011-248618 A | 12/2011 |
| JP | 2013-009531 A | 1/2013 |
| JP | 2015-121520 A | 7/2015 |
| JP | 2015-181327 A | 10/2015 |
| JP | 2017-085724 A | 5/2017 |
| JP | 2017-110969 A | 6/2017 |
| WO | WO-2011/112862 A1 | 9/2011 |
| WO | WO-2016/158783 A1 | 10/2016 |

* cited by examiner

INFORMATION PROCESSING DEVICE, INFORMATION PROCESSING SYSTEM, INFORMATION PROCESSING METHOD, AND COMPUTER PROGRAM

CROSS REFERENCE TO RELATED APPLICATIONS

This application is a national stage application, filed under 35 U.S.C. § 371, of International Application No. PCT/JP2020/016257, filed Apr. 13, 2020, which international application claims priority to and the benefit of Japanese Patent Application No. 2019-084792, filed Apr. 26, 2019; the contents of both which as are hereby incorporated by reference in their entireties.

BACKGROUND

Technical Field

The present invention relates to an information processing device, an information processing system, an information processing method, and a computer program for presenting information of an energy storage device.

Description of Related Art

The use of energy storage devices in large-scale systems that store renewable energy or power generated by existing power generating systems is expanding.

In a system using an energy storage device, maintenance activities including execution of state diagnosis of the energy storage device, estimation of a state of charge (SOC), execution of life prediction, and the like are important. A technique has been proposed in which a user of an energy storage device or a person in charge of maintenance can remotely acquire information of an SOC or life prediction of the energy storage device included in these systems via a server device.

BRIEF SUMMARY

An energy storage device such as a lead-acid battery or a lithium ion battery is increasingly applied to industrial applications other than vehicle-mounted applications (automotive applications, motorcycle applications). For example, energy storage devices may be juxtaposed in a solar power generating system or a wind power generating system. In a large-scale power generating system, a very large number of energy storage devices are installed and used. Even in the case of realizing power peak cutting in a factory or a large-scale facility, a very large number of energy storage devices are installed and used. The conventional maintenance support system does not assume a case where such a large number of energy storage devices are installed in a distributed power supply system or a business entity.

In a large-scale energy storage system (ESS), the number of energy storage cells to be monitored is enormous, and there is room for improvement in how to present the latest event currently occurring in the ESS in an easy-to-understand manner.

An object of the present invention is to provide an information processing device, an information processing system, an information processing method, and a computer program making it possible to visually and easily grasp a state of an energy storage device.

An information processing device according to one aspect of the present invention includes: an acquisition unit configured to acquire information including a state of an energy storage device by communication at predetermined time intervals; a storage processing unit configured to store the acquired information in a storage medium in association with information for identifying the energy storage device; a transmission processing unit configured to transmit screen information of a state screen including an image of a system including the energy storage device and a graphic indicating the state of the energy storage device to a communication terminal device; and an automatic monitor unit configured to update information of the graphic based on latest information stored in the storage medium and periodically transmit the information of the graphic to the communication terminal device.

DETAILED DESCRIPTION OF VARIOUS EMBODIMENTS

Figure 1:
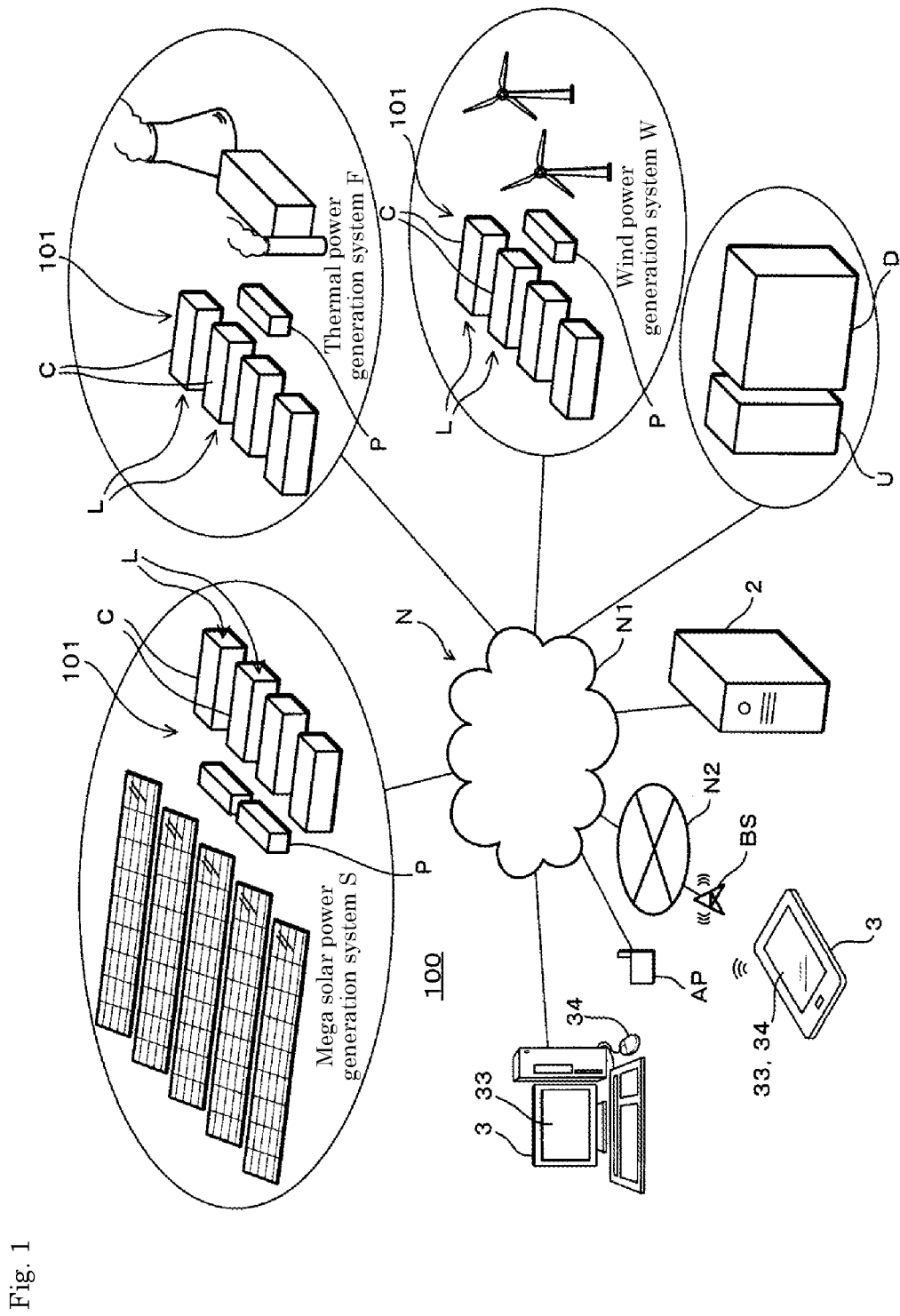
FIG. 1 is a diagram showing an outline of a remote monitoring system.

An information processing device includes: an acquisition unit configured to acquire information including a state of an energy storage device by communication at predetermined time intervals; a storage processing unit configured to store the acquired information in a storage medium in association with information for identifying the energy storage device; a transmission processing unit configured to transmit screen information of a state screen including an image of a system including the energy storage device and a graphic indicating the state of the energy storage device to a communication terminal device; and an automatic monitor unit configured to update information of the graphic based on latest information stored in the storage medium and periodically transmit the information of the graphic to the communication terminal device.

Here, the "latest information" may be latest information (information acquired at the last acquisition timing) among the information acquired by the acquisition unit through communication, or may be information generated by processing some of the latest information (for example, on average or in comparison).

The energy storage device may include a plurality of energy storage cells, modules, or banks (strings).

The automatic monitor unit may include web application software executed by the information processing device.

With such a configuration, an operator can visually and easily grasp the latest state of the energy storage device almost in real time.

The screen information may be created corresponding to a plurality of state screens in which ranges of the energy storage devices to be displayed are different from each other, and, in the graphic, the range of the energy storage device whose state is indicated by the graphic may differ between one state screen and another state screen.

The screen information may be created corresponding to a state screen obtained by dividing the energy storage devices in the same layer into a plurality of ranges.

The screen information may be created corresponding to a plurality of state screens in which ranges of the energy storage devices to be displayed are hierarchically different from each other, and, in the graphic, the range of the energy storage device whose state is indicated by the graphic may differ between one state screen and another state screen. That is, the graphic indicating the state of the energy storage device may differ between a state screen on which the energy storage device in the upper layer (in a first range) is displayed on one screen of the display unit and a state screen on which the energy storage device in the lower layer (in a second range narrower than the first range included in the first range) is displayed on one screen of the display unit.

Conventionally, a system in which an e-mail is sent to a user or an administrator of a device when an abnormality occurs in the device to be monitored or when maintenance becomes necessary is used in various fields.

Among various fields and devices, in an energy storage system including an energy storage device such as a lithium ion battery, the number of monitoring targets (energy storage cells, modules, or banks) is remarkably large. Therefore, for a large-scale ESS, even if an electronic mail for notifying abnormality of some of the energy storage cells and notifying necessity of maintenance arrives as in the conventional system, it is difficult to grasp the situation of the entire ESS and to determine what kind of treatment is required at what degree of urgency. In the large-scale ESS, in many cases, even if there is an abnormality in some of the energy storage cells, the entire ESS is operated without any trouble. In the large-scale ESS, it is preferable that the presence or absence of an abnormality that does not affect the entirety and the presence or absence of an abnormality that affects the entirety are managed by different determination criteria.

With the above-described configuration, by sequentially transmitting the updated graphics from the information processing device, the operator can intuitively grasp the state of the system including a very large number of energy storage devices in a visual manner almost in real time. The state screen may transition from the entirety to a part and from the part to a more detailed part according to the hierarchical structure of the ESS. The operator can visually confirm the situation of the entire ESS from the state screen without the need to check the state of each energy storage cell, module, or bank one by one, for example, the SOC. As a result, the reliability of the system can be enhanced for the user of the system. When a problem occurs in the energy storage device, the operator can visually grasp what kind of treatment is appropriate at which place in the system. Accordingly, it is possible to reduce a possibility that a person in charge of maintenance is confused as to which place the energy storage device should be subjected to maintenance inspection, and it is possible to improve efficiency of handling by the person in charge of maintenance.

The graphic may include a color, a shape, or an illustration corresponding to the state of the energy storage device.

The graphic may include a first graphic indicating a state of an energy storage cell, a module, a bank, or a plurality of banks of the energy storage device, the first graphic being superimposed on a position where the energy storage device is shown or a position where the energy storage device is drawn in an image of a system including the energy storage device.

The first graphic may indicate a state of at least one of a voltage, a current, and a temperature of the energy storage cell, the module, the bank, or the plurality of banks.

With the above configuration, the operator can visually confirm the state of the entire energy storage system or the energy storage devices in an optional range from the state screen by the color, shape, or illustration of the graphic without the need to check the state of each energy storage cell/module/bank one by one. As a result, the reliability of the system can be enhanced for the user of the system. Depending on the superimposed position of the first graphic on the system image and the aspect of the graphic, the operator can quickly grasp what kind of problem (how degree of problem) has occurred at which place of the energy storage device, and it is possible to improve efficiency of handling by the person in charge of maintenance.

The graphic may include a second graphic indicating an SOC of the energy storage device.

The SOC by the second graphic may be matched with an SOC output from a power conditioner connected to the energy storage device.

With such a configuration, it is possible to visually and easily grasp the state of charge of the energy storage device. The reliability of the system can be enhanced for the user of the system.

An information processing system includes: communication devices connected to or mounted on an energy storage device; and an information processing device capable of establishing communication connection with the plurality of communication devices, and the information processing device includes: an acquisition unit configured to acquire information including a state of the energy storage device by communication at predetermined time intervals; a storage processing unit configured to store the acquired information in a storage medium in association with information for identifying the energy storage device; a transmission processing unit configured to transmit screen information on a state screen including an image of a system including the energy storage device and a graphic indicating the state of the energy storage device to a communication terminal device; and an automatic monitor unit configured to update the graphic based on latest information stored in the storage medium and periodically transmit the graphic to the communication terminal device.

In an information processing method, an information processing device transmits information of an energy storage device in response to a request or as an event. The information processing method includes the steps of: acquiring information including a state of the energy storage device by communication using a plurality of communication devices connected to or mounted on the energy storage device; storing the acquired information in a storage medium in association with information for identifying the energy storage device; transmitting screen information on a state screen including an image of a system including the energy storage device and a graphic indicating the state of the energy storage device to a communication terminal device; and updating the graphic based on latest information stored in the storage medium and periodically transmitting the graphic to the communication terminal device.

A computer program causes a computer including a display unit to display information of an energy storage device. The computer program causes the computer to execute: a step of requesting information of the energy storage device for each system including the energy storage device or each place where the energy storage device is installed; a step of displaying a state screen on the display unit based on screen information of the state screen including an image of a system including the energy storage device and a graphic indicating a state of the energy storage device, the screen information being transmitted in response to a request; and a step of displaying the updated state screen on the display unit based on updated information of the graphic that is periodically transmitted.

Hereinafter, the present invention will be specifically described with reference to the drawings showing an embodiment thereof.

FIG. 1 is a diagram showing an outline of a remote monitoring system 100. The remote monitoring system 100 enables remote access to information on energy storage devices and power supply related devices included in a mega solar power generating system S, a thermal power generating system F, and a wind power generating system W. An uninterruptible power system (UPS) U and a rectifier (d.c. power supply or a.c. power supply) D disposed in a stabilized power supply system for a railway or the like may be remotely monitored.

A power conditioning system (PCS) P and an energy storage system 101 are juxtaposed in each of the mega solar power generating system S, the thermal power generating system F, and the wind power generating system W. The energy storage system 101 may be configured by arranging a plurality of containers C each accommodating an energy storage module group L. Alternatively, the energy storage module groups L and the power conditioner P may be disposed in a building (energy storage room). The energy storage module group L includes a plurality of energy storage devices. The energy storage devices are preferably secondary batteries such as lead-acid batteries or lithium ion batteries or capacitors, which are rechargeable. Some of the energy storage devices may be a non-rechargeable primary battery.

In the remote monitoring system 100, a communication device 1 (see FIG. 2) is mounted on/connected to each of the energy storage systems 101 or devices (P, U, D and management devices M to be described later) in the systems S, F, and W to be monitored. The remote monitoring system 100 includes the communication devices 1 (information processing devices), a server device 2 (communication device) that collects information from the communication devices 1, a client device 3 (communication device) for browsing the collected information, and a network N that is a communication medium between the devices.

The communication device 1 may be a terminal device (measurement monitor) that communicates with a battery management unit (BMU) included in the energy storage device to receive information of the energy storage device, or may be a controller compatible with ECHONET/ECHONETLite (registered trademark). The communication device 1 may be an independent device or a network card type device that can be mounted on the power conditioner P or the energy storage module group L. The communication device 1 is provided for each group including a plurality of energy storage modules in order to acquire information of the energy storage module group L in the energy storage system 101. A plurality of the power conditioners P are connected so as to be able to perform serial communication, and the communication device 1 is connected to a control unit of one of the representative power conditioners P.

The server device 2 has a web server function, and presents information obtained from the communication device 1 mounted on/connected to each device to be monitored according to access from the client device 3.

The network N includes a public communication network N1 that is a so-called Internet and a carrier network N2 that realizes wireless communication according to a predetermined mobile communication standard. The public communication network N1 includes a general optical line, and the network N includes a dedicated line connected to the server device 2. The network N may include a network compatible with ECHONET/ECHONETLite. The carrier network N2 includes a base station BS, and the client device 3 can communicate with the server device 2 from the base station BS via the network N. An access point AP is connected to the public communication network N1, and the client device 3 can transmit and receive information from the access point AP to and from the server device 2 via the network N.

Figure 2:
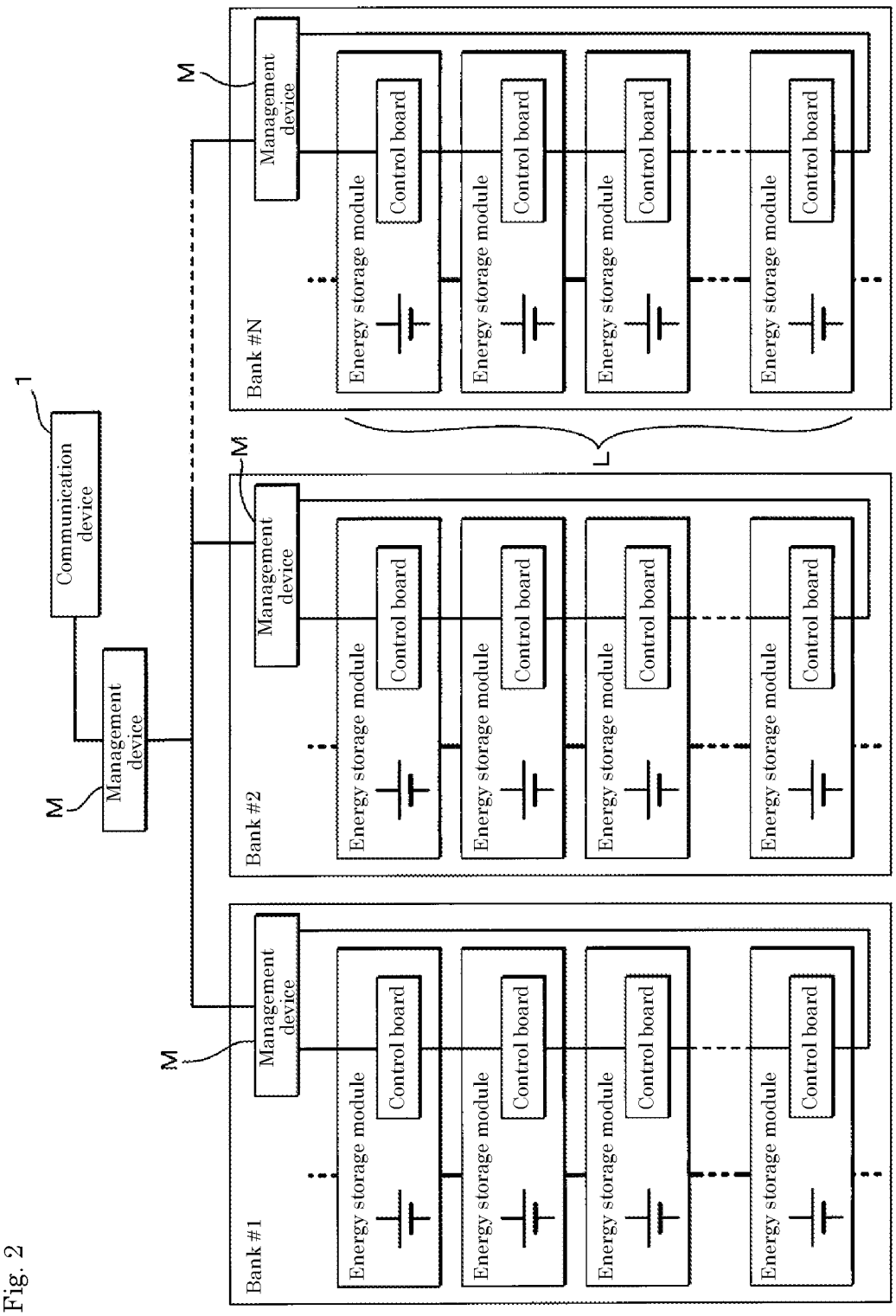
FIG. 2 is a diagram showing an example of a hierarchical structure of energy storage module groups and a connection form of a communication device.

The energy storage module groups L of the energy storage system 101 have a hierarchical structure. The communication device 1 that transmits the information of the energy storage devices to the server device 2 acquires the information of the energy storage module group from the management device M provided in the energy storage module group L. FIG. 2 is a diagram showing an example of a hierarchical structure of the energy storage module groups L and a connection form of the communication device 1. The energy storage module group L has a hierarchical structure including, for example, an energy storage modules (also referred to as modules) in which a plurality of energy storage cells (also referred to as cells) are connected in series, a bank in which a plurality of energy storage modules are connected in series, and a domain in which a plurality of banks are connected in parallel. In the example of FIG. 2, one management device M is provided for each of the banks numbered (#) 1 to N and the domain in which the banks are connected in parallel. The management device M provided for each bank communicates with a control board (cell monitoring unit (CMU)) with a communication function built in each energy storage module by serial communication, and acquires measurement data (current, voltage, temperature) for the energy storage cells in the energy storage module. The management device M for a bank executes management processing such as detection of an abnormality in the communication state. Each of the management devices M for a bank transmits measurement data obtained from the energy storage modules of each bank to the management device M provided in the domain. The management device M for a domain aggregates information such as measurement data obtained from the management devices M for a bank belonging to the domain and detected abnormality. In the example of FIG. 2, the communication device 1 is connected to the management device M for a domain. Alternatively, the communication device 1 may be connected to each of the management device M for a domain and the management devices M for banks.

The energy storage system 101 described below is configured as a large-scale ESS including a plurality of domains in which the banks shown in FIG. 2 are connected in parallel. The management device M can acquire identification data (identification number) of a domain or a bank of a device to which the management device M is connected.

In the remote monitoring system 100, the server device 2 collects state information such as an SOC, a state of health (SOH), or the like in the energy storage system 101 and a detected abnormality information, using the communication device 1 mounted on each device, and presents the state of the energy storage system 101 based on the collected data.

Figure 3:
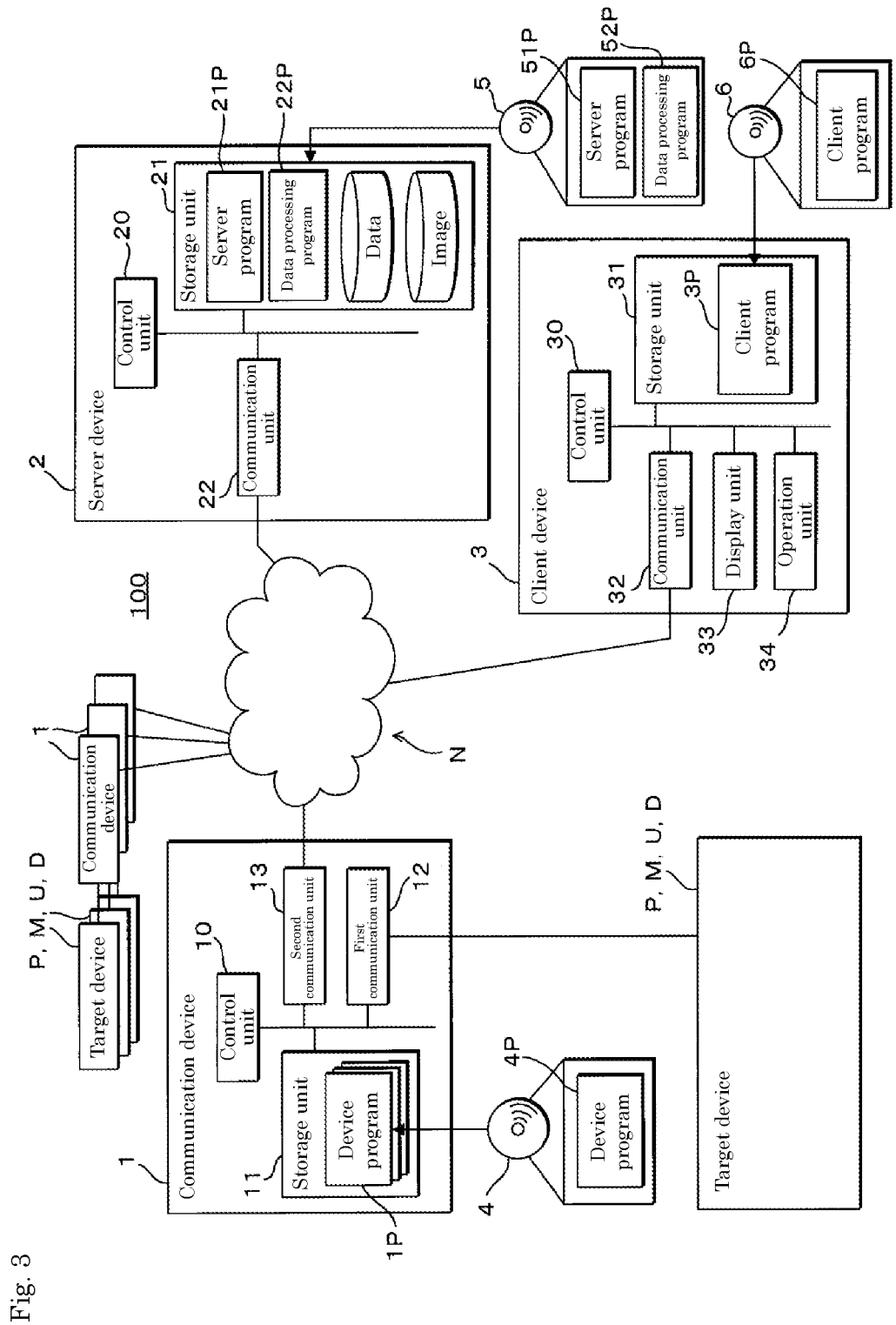
FIG. 3 is a block diagram showing internal configurations of devices included in the remote monitoring system.

FIG. 3 is a block diagram showing internal configurations of devices included in the remote monitoring system 100. As shown in FIG. 3, the communication device 1 includes a control unit 10, a storage unit 11, a first communication unit 12, and a second communication unit 13. The control unit 10 is a processor using a central processing unit (CPU), and executes processing by controlling each component using built-in memories such as a read only memory (ROM) and a random access memory (RAM).

The storage unit 11 uses a non-volatile memory such as a flash memory. The storage unit 11 stores a device program 1P read and executed by the control unit 10. The device program 1P includes a communication program conforming to Secure Shell (SSH), Simple Network Management Protocol (SNMP), or the like. The storage unit 11 stores information such as information collected by the processing of the control unit 10 and an event log. The information stored in the storage unit 11 can also be read out via a communication interface such as a USB whose terminal is exposed to a housing of the communication device 1. The device program 1P stored in the storage unit 11 may be obtained by reading a device program 4P stored in the recording medium 4 and copying the device program 4P to the storage unit 11.

The first communication unit 12 is a communication interface that realizes communication with a monitoring target device to which the communication device 1 is connected. The first communication unit 12 uses, for example, a serial communication interface such as an RS-232C or an RS-485. For example, the power conditioner P includes a control unit having a serial communication function conforming to the RS-485, and the first communication unit 12 communicates with the control unit. When the control boards included in the energy storage module group L are connected by a controller area network (CAN) bus and communication between the control boards is realized by CAN communication, the first communication unit 12 is a communication interface based on a CAN protocol. The first communication unit 12 may be a communication interface compatible with the ECHONET/ECHONETLite standard.

The second communication unit 13 is an interface that realizes communication via the network N, and uses, for example, Ethernet (registered trademark) or a communication interface such as a wireless communication antenna. The control unit 10 is communicably connectable to the server device 2 via the second communication unit 13. The second communication unit 13 may be a communication interface compatible with the ECHONET/ECHONETLite standard.

In the communication device 1 configured as described above, the control unit 10 acquires, via the first communication unit 12, measurement data for the energy storage devices obtained in the device to which the communication device 1 is connected. The control unit 10 may function as an SNMP agent and respond to an information request from the server device 2 by reading and executing an SNMP program.

The server device 2 uses a server computer, and includes a control unit 20, a storage unit 21, and a communication unit 22. In the present embodiment, the server device 2 will be described as one server computer, but processing may be distributed among a plurality of server computers.

The control unit 20 is a processor using a CPU or a graphics processing unit (GPU), and executes processing by controlling each component using a built-in memory such as a ROM and a RAM. The control unit 20 executes communication and information processing based on a server program 21P stored in the storage unit 21. The server program 21P includes a web server program, and the control unit 20 functions as a web server that executes provision of a web page to the client device 3. The control unit 20 collects information from the communication device 1 as an SNMP server based on the server program 21P.

The storage unit 21 uses, for example, a non-volatile memory such as a hard disk or a flash memory. The storage unit 21 stores the server program 21P described above and a data processing program 22P. The server program 21P and the data processing program 22P stored in the storage unit 21 may be obtained by reading a server program 51P and a data processing program 52P stored in the recording medium 5 and copying them to the storage unit 21.

The storage unit 21 stores measurement data of the power conditioners P and the energy storage module groups L of the energy storage system 101 to be monitored collected by the processing of the control unit 20. The measurement data is associated with identification information (number) for identifying the energy storage system 101 or the power conditioner P. The measurement data of the energy storage module group L is stored according to a domain, a bank, a module, or a cell and a hierarchical structure.

The storage unit 21 stores a plurality of images for displaying the states of the energy storage module group L or the devices P, U, and D to be monitored. The plurality of images are stored in the storage unit 21 in association with identification information for identifying the energy storage module group L or the devices P, U, and D to be monitored. The plurality of images include images representing the energy storage module group L or the devices P, U, and D. The plurality of images include images indicating the arrangement of the energy storage module group L or the devices P, U, and D. These images are photographs such as aerial photographs and satellite photographs, 2D maps, design drawings, CAD drawings, or illustrations. These images may be stored by being uploaded from the client device 3. In the photograph, the map, the design drawing, the drawing, or the illustration, the position or range of the energy storage module group L or the devices P, U, and D to be monitored is stored for each image. The information indicating the position or range is, for example, coordinate information corresponding to an image. When the image is an aerial photograph, a satellite photograph, or a map, the information may be latitude and longitude information and information indicating a relative position. The plurality of images stored in the storage unit 21 include images such as illustrations, icons, and animations for expressing the state of the energy storage module group L or the devices P, U, and D. In addition to the images for displaying the state, the storage unit 21 stores design data such as a style sheet and a script for visually outputting the states of the energy storage system 101 and the devices P, U, and D on a web basis.

The communication unit 22 is a communication device that realizes communication connection and transmission and reception of information via the network N. Specifically, the communication unit 22 is a network card compatible with the network N.

The client device 3 is a computer used by an operator such as an administrator or a person in charge of maintenance of the energy storage system 101 each of the power generating systems S, F, and W. The client device 3 may be a desktop or laptop personal computer, or a so-called smartphone or a tablet communication terminal. The client device 3 includes a control unit 30, a storage unit 31, a communication unit 32, a display unit 33, and an operation unit 34.

The control unit 30 is a processor using a CPU. The control unit 30 causes the display unit 33 to display a web page provided by the server device 2 based on a client program 3P stored in the storage unit 31. The client program 3P is incorporated in a web page provided by a web server function of the server device 2, includes a split and a web browser program temporarily stored in the client device 3, and is a program for displaying a web-based screen based on an operation in the server device 2.

The storage unit 31 uses, for example, a non-volatile memory such as a hard disk or a flash memory. The storage unit 31 stores various programs including the client program 3P. The client program 3P may be obtained by reading a client program 6P stored in a recording medium 6 and copying the client program 6P to the storage unit 11.

The communication unit 32 uses a communication device such as a network card for wired communication, a wireless communication device for mobile communication connected to the base station BS (see FIG. 1), or a wireless communication device compatible with connection to the access point AP. The control unit 30 can perform communication connection or transmission and reception of information with the server device 2 via the network N by the communication unit 32.

As the display unit 33, a display such as a liquid crystal display or an organic electro luminescence (EL) display is used. The display unit 33 displays an image of a web page provided by the server device 2 by processing based on the client program 3P of the control unit 30. The display unit 33 is preferably a touch panel built-in display, but may be a touch panel non-built-in display.

The operation unit 34 is a keyboard and a pointing device capable of inputting and outputting to and from the control unit 30, or a user interface such as a sound input unit. The operation unit 34 may use a touch panel of the display unit 33 or a physical button provided on a housing. The operation unit 34 notifies the control unit 30 of operation information by the user.

In the remote monitoring system 100 configured as described above, the server device 2 periodically acquires various pieces of information including the states of the power conditioners P, the energy storage module groups L (management devices M), an uninterruptible power system U, and a rectifier D from the communication devices 1 based on the data processing program 22P, and stores the information in the storage unit 21. The communication device 1 transmits state information on each energy storage module group L in association with the master-slave relationship corresponding to the hierarchical structure. Based on information acquired from the energy storage devices or each power supply related device using the communication device 1, the server device 2 creates screen information visually representing the state of the system or device to be monitored according to the hierarchical structure of the energy storage cell, and transmits and presents the screen information to the client device 3.

Figure 4:
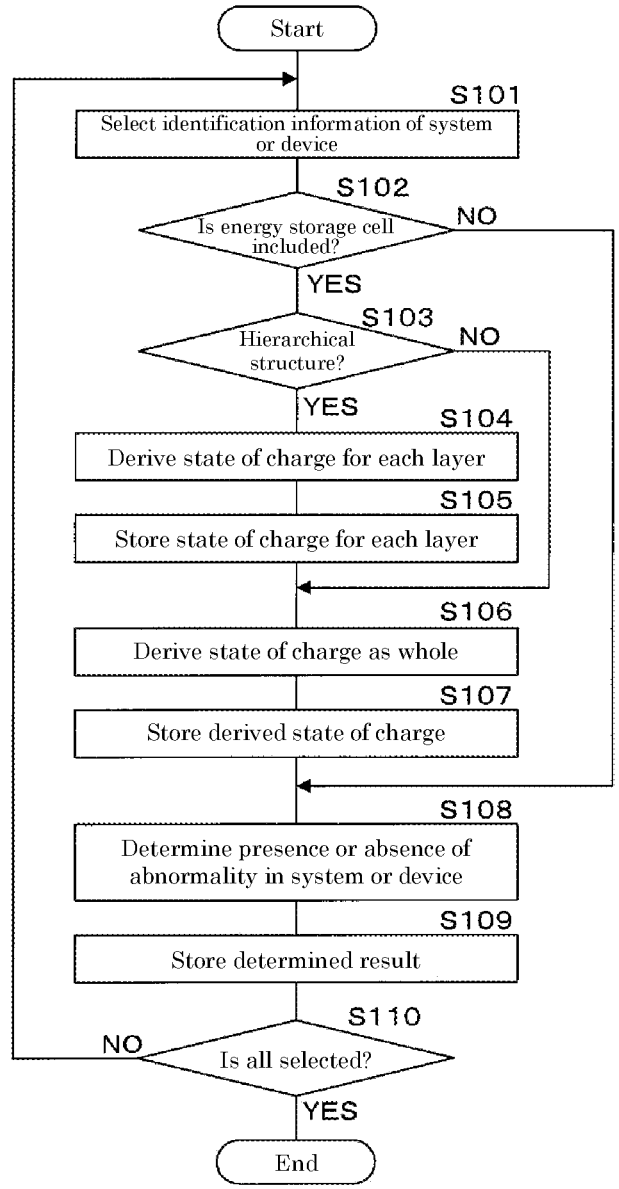
FIG. 4 is a flowchart showing an example of a processing procedure of information presentation in a server device.

FIG. 4 is a flowchart showing an example of a processing procedure of information presentation in the server device 2. Using the information of the power conditioner P, the energy storage module group L (management device M), the uninterruptible power system U, and the rectifier D which are periodically acquired from the communication device 1 and stored in the storage unit 21, the server device 2 executes the following processing in response to a request from the client device 3 or as an event. The event may be arrival of a cycle, or may be detection of a state change of a system or a device such as occurrence of an abnormality.

The control unit 20 selects one piece of identification information for identifying a system or device to be monitored (step S101).

The control unit 20 determines whether or not the system or the device identified by the selected identification information includes the energy storage cell (step S102). When it is determined that the energy storage cell is included (S102: YES), it is determined whether or not the system or the device identified by the selected identification information includes the energy storage cell having the hierarchical structure (step S103).

When it is determined in step S103 that the energy storage cell having the hierarchical structure is included (S103: YES), the control unit 20 derives a state of charge (SOC) for each layer (step S104). In step S104, the layer is, for example, a domain, a bank, or a module in the case of the energy storage system 101 having the structure as shown in FIG. 2.

The control unit 20 temporarily stores the SOC derived for each layer together with the identification information of the energy storage module group L of the upper layer in association with the identification information of the selected system or device and the name (identification number) for identifying each energy storage module group L of the hierarchical structure (step S105).

When it is determined in step S103 that the energy storage cell is not included hierarchically (S103: NO), the control unit 20 derives the SOC of the entire energy storage cell included in the system or device identified by the selected identification information (step S106), and temporarily stores the SOC in association with the identification information of the selected system or device (step S107).

Next, the control unit 20 determines the presence or absence of an abnormality in the system or device identified by the selected identification information (step S108), and temporarily stores the determined result in association with the identification information of the selected system or device (step S109).

When it is determined in step S102 that the energy storage cell is not included (S102: NO), the control unit 20 advances the processing to step S108.

The control unit 20 determines whether or not all the pieces of identification information for identifying the system or device to be monitored have been selected (step S110). When it is determined that all the pieces of identification information have been selected (S110: YES), the control unit 20 ends one processing. When it is determined in step S110 that all the pieces of identification information have not been selected (S110: NO), the control unit 20 returns the processing to step S101 and selects identification information of a next system or device.

By the processing shown in the flowchart of FIG. 4, the state at the timing when there is a request from the client device 3 or the timing when an event occurs (state change or the like) is temporarily stored in the storage unit 21 or a temporary storage unit built in the control unit 20. The stored state information is updated every timing when there is a request from the client device 3 or every timing when an event occurs (state change or the like).

Figure 5:
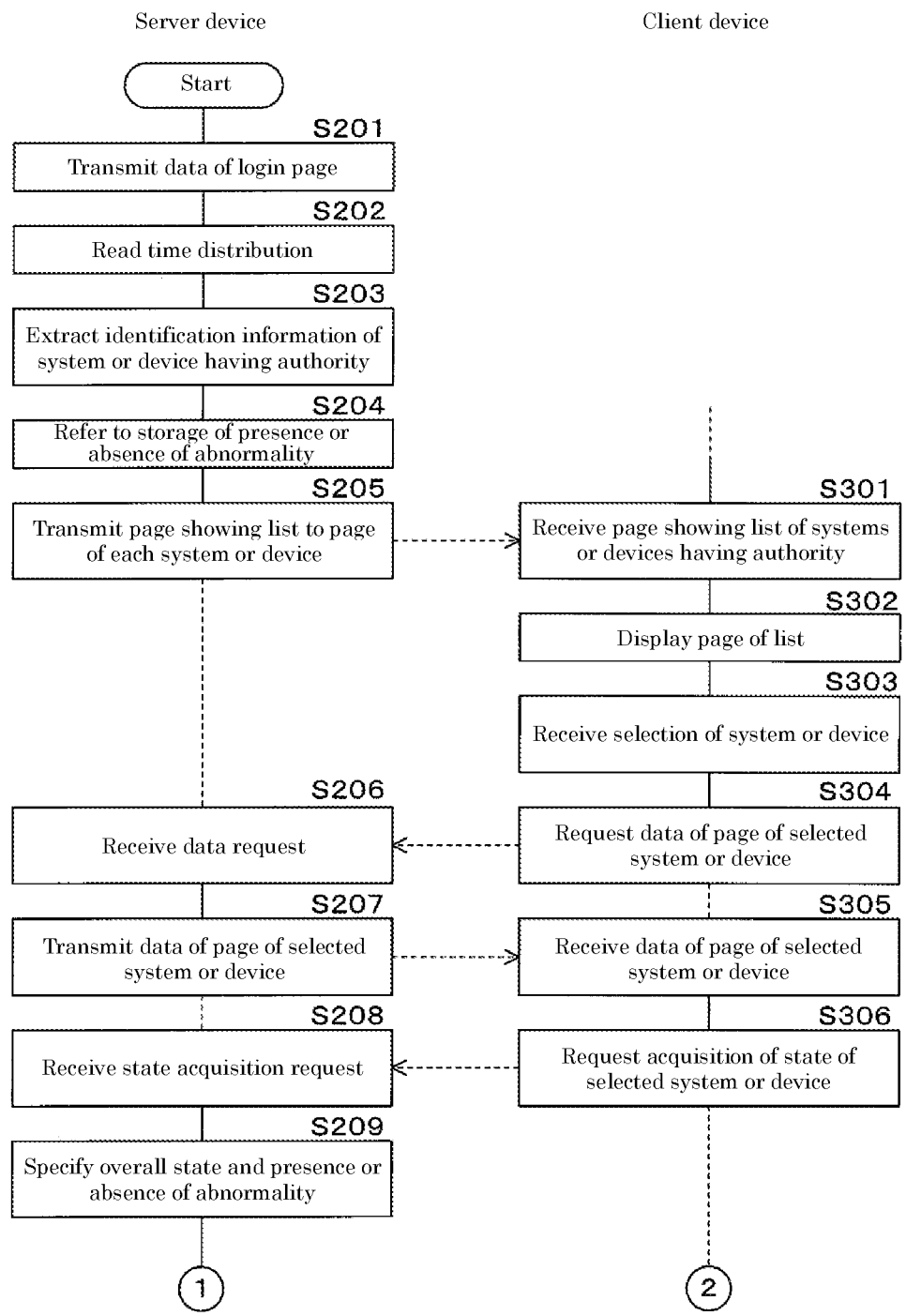
FIG. 5 is a flowchart showing an example of a processing procedure of information presentation from the server device to a client device.
Figure 6:
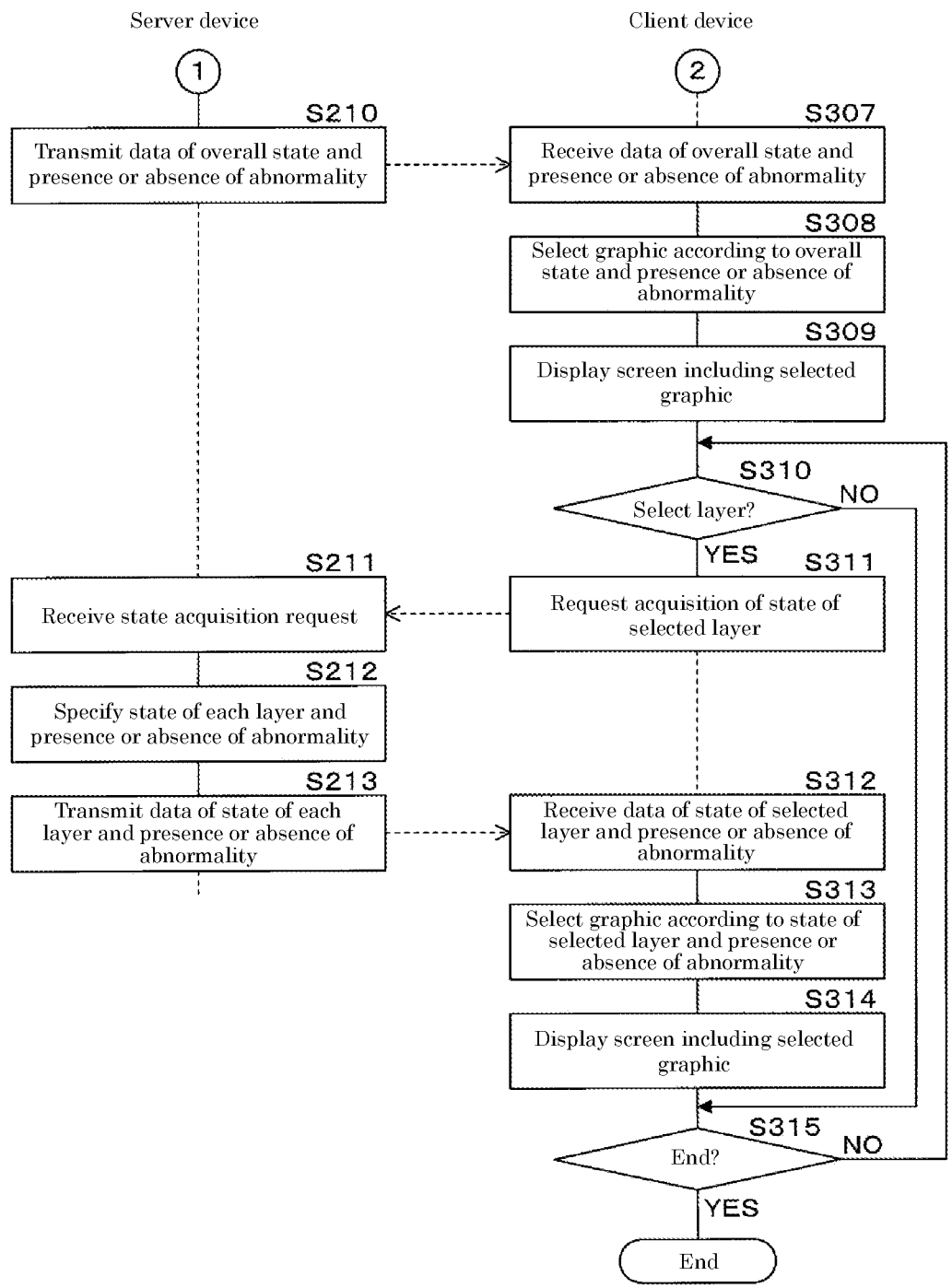
FIG. 6 is a flowchart showing an example of a processing procedure of information presentation from the server device to the client device.

FIGS. 5 and 6 are flowcharts each showing an example of a processing procedure of information presentation from the server device 2 to the client device 3. When the client device 3 receives a login request from a web browser, the following processing is started.

The control unit 20 transmits data of a login page for receiving login data in the client device 3 as a web server to the client device 3 (step S201). The control unit 20 receives login data based on an operation on the operation unit 34 on a login screen displayed on the display unit 33 of the client device 3 (step S202). The login data includes an ID and a password for identifying an administrator or an operator who uses the client device 3. The login data may include biometric information or the like instead of the password.

Based on the received login data, the control unit 20 extracts identification information of a system or a device having access authority stored in association with the login data (step S203). The control unit 20 refers to the storage of the presence or absence of an abnormality of each system or device corresponding to the extracted identification information (step S204). In step S204, the control unit 20 refers to the information of the presence or absence of an abnormality appropriately updated according to the flowchart of FIG. 4. The control unit 20 transmits, to the client device 3, information of a web page in which an icon indicating the presence or absence of an abnormality referred to in step S204 is added to a list of link information to another web page for displaying information of each system or device corresponding to the identification information extracted in step S203 (step S205). In a case where there is a single system or device alone having access authority associated with login information, in step S205, data of a web page for displaying information of the single system or device alone is transmitted to the client device 3 (S207 to be described later).

The client device 3 receives data of a web page of a list of systems or devices having access authority by the communication unit 32 (step S301), and displays the web page of the list on the display unit 33 (step S302). The control unit 30 receives selection of a desired system or device from the list of link information displayed based on the received data (step S303), and transmits a request for data of a web page indicated by the selected link information to the server device 2 (step S304).

The control unit 20 of the server device 2 receives the data request of the web page of the target system or device (step S206), and transmits the data of the web page for displaying the information of the selected system or device to the client device 3 (step S207). The data of the web page transmitted in step S207 includes an image representing the selected system or device, an image indicating arrangement, coordinate data indicating the position of the system or device in the image, and graphic data such as an illustration, an icon, and an animation for expressing a state.

The control unit 30 of the client device 3 receives the data of the web page (step S305), and requests the server device 2 to acquire the state of the selected system or device based on the script included in the received data (step S306).

The control unit 20 of the server device 2 receives the state acquisition request (step S208), and determines the state of the uppermost layer of the target system or device, that is, the overall state and the presence or absence of an abnormality (step S209). The control unit 20 determines the overall state of the system or the device with reference to a soundness range stored in association with the system or the device. For example, the control unit 20 calculates an average of the SOC of the energy storage devices constituting the system or the device, and determines that the state is sound when the average is included in the SOC range stored as the soundness range. In this case, the control unit 20 obtains the average of the SOC by dividing the average of the SOC by the number of modules or cells in operation of the energy storage devices. The control unit 20 may determine the state based on whether or not the number of cells, modules, banks, or domains in operation among the energy storage devices constituting the system or the device is within a previously stored soundness range. The control unit 20 may determine the state based on whether or not the average of the charge-discharge current from or the temperature of the energy storage devices constituting the system or the device is within a previously stored soundness range.

In a case where the state is stored for each layer in the control unit 20, the control unit 20 refers to the state of the uppermost layer. The control unit 20 transmits, to the client device 3, data indicating the state determined in step S209 for the selected system or device and the presence or absence of an abnormality (step S210).

The control unit 30 of the client device 3 receives data indicating the state of the target system or device and the presence or absence of an abnormality (step S307). The control unit 30 selects graphic data corresponding to the state indicated by the received data or the presence or absence of an abnormality from the received data (step S308), and causes the display unit 33 to display a web page including an image representing a target system or device using the selected graphic data or the like (step S309).

The control unit 30 of the client device 3 determines whether or not another layer is selected for the energy storage module groups L having the hierarchical structure included in the target system or device (step S310). When it is determined in step S310 that another layer is selected (S310: YES), the acquisition of the state of the energy storage module group L in the selected layer is requested to the server device 2 (step S311).

The control unit 20 of the server device 2 receives the state acquisition request (step S211), and determines the state of the energy storage module group L in the target layer and the presence or absence of an abnormality (step S212). The control unit 20 transmits data indicating the determined state of the energy storage module group L in the selected layer and the presence or absence of an abnormality to the client device 3 (step S213).

The control unit 30 of the client device 3 receives data indicating the state of the selected layer and the presence or absence of an abnormality (step S312). The control unit 30 selects graphic data corresponding to the state indicated by the received data or the presence or absence of an abnormality from the received data (step S313), and causes the display unit 33 to display a web page including an image representing the state of the target layer using the selected graphic data or the like (step S314).

The control unit 30 of the client device 3 determines whether or not an operation for terminating the display of the web page of the target system or device has been received (step S315), and when it is determined that the operation has not been received (S315: NO), the processing returns to step S310. Whether or not the termination operation in step S315 has been received is determined based on whether or not the web browser has been terminated, whether or not logout has been selected, or whether or not transition to a web page of a list of systems or devices alone having access authority has been selected.

When it is determined in step S315 that the termination operation has been received (S315: YES), the processing of information presentation is terminated.

In the description with reference to the flowchart of FIG. 6, when the selection operation is received by the operation unit 34 based on the script included in the data of the received web page, the control unit 30 of the client device 3 requests acquisition of the state of the selected system or device (S306). Accordingly, the server device acquires data by the data processing program 22 and transmits the data to the client device (S210). That is, the screen has transitioned according to the operation of the operator of the client device 3.

Figure 7:
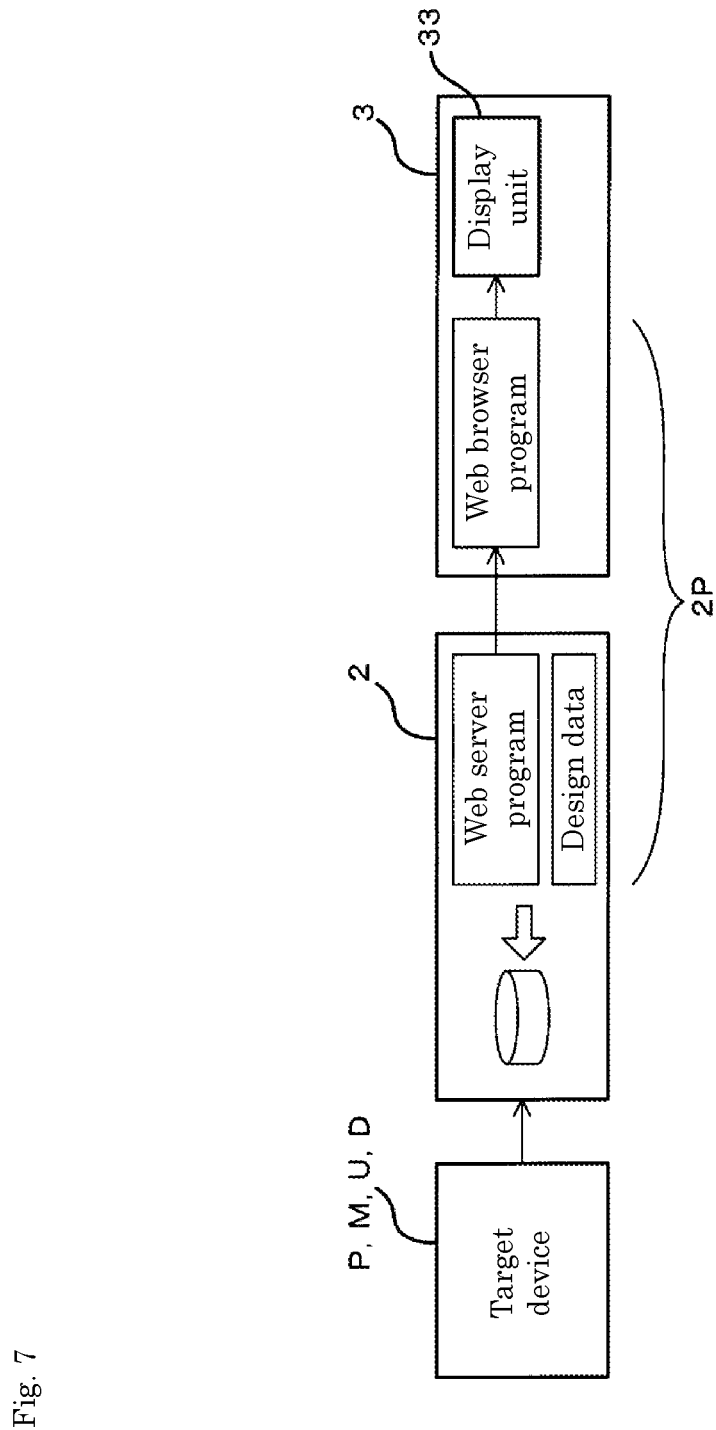
FIG. 7 is a diagram explaining functions of an automatic monitor unit.

Alternatively, the script for automatic update may be included in the script of the data transmitted from the server device 2 in the web page displaying at least the uppermost layer, that is, the overall state. As a result, the server device 2 shown in FIG. 3 may periodically refer to the data in the storage unit 21 and transmit a web page based on the referred data to the client device 3 at a predetermined cycle. As shown in FIG. 7, the automatic update of the state display may be realized by a function (hereinafter, referred to as "automatic monitor") 2P based on the cooperation of the web server program and the design data included in the server program 21P and the web browser program included in the client program 3P. The automatic monitor 2P may realize transmission of data to the client device 3 by https communication at intervals of 10 seconds or 15 seconds, for example.

Figure 8:
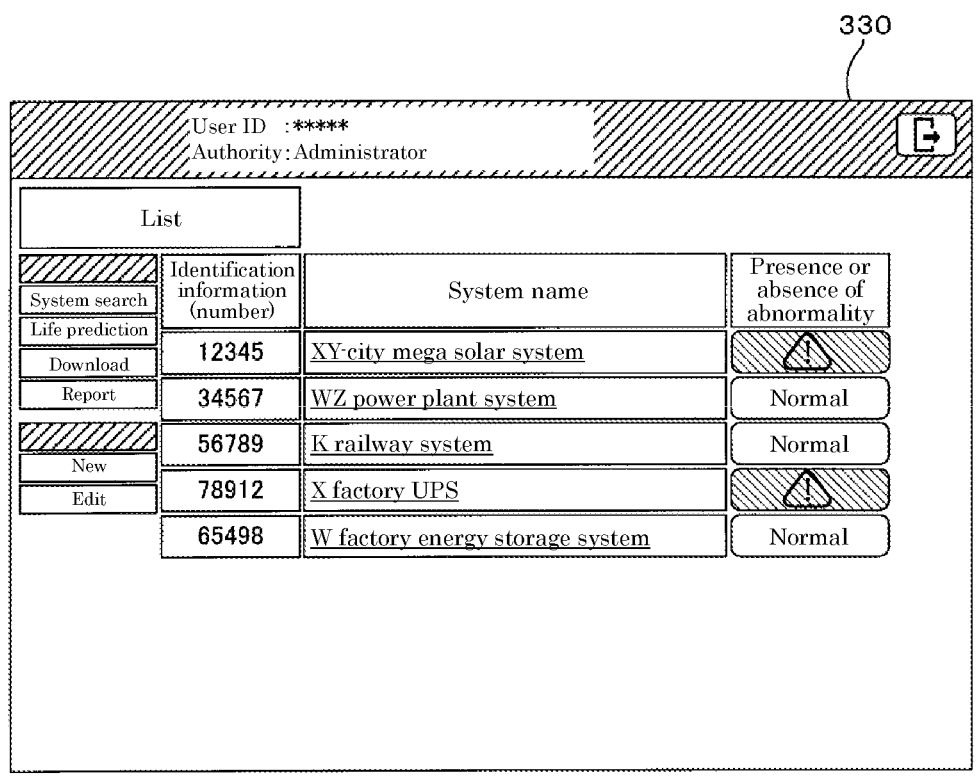
FIG. 8 is a diagram showing an example of a screen displayed based on screen information.

A processing procedure of screen display based on a web page transmitted from the server device 2 will be described with reference to screen examples shown in FIGS. 8 to 11. FIG. 8 shows a web screen 330 (screen displayed on the display unit 33 of the client device 3) including a list of names of authorized systems or devices in step S302 in FIG. 5. In the example of FIG. 8, the name of the mega solar power generating system S shown in FIG. 1 "XY-city mega solar system", the name of the wind power generating system W "WZ power plant system", "K railway system", "X factory system", and the like are displayed as links together with identification information. The name may represent a place where the energy storage module group L and/or the devices P, U, and D are installed, such as "XY-city mega solar system". The web screen 330 including the list may include an icon indicating the presence or absence of an abnormality for each system.

Figure 9:
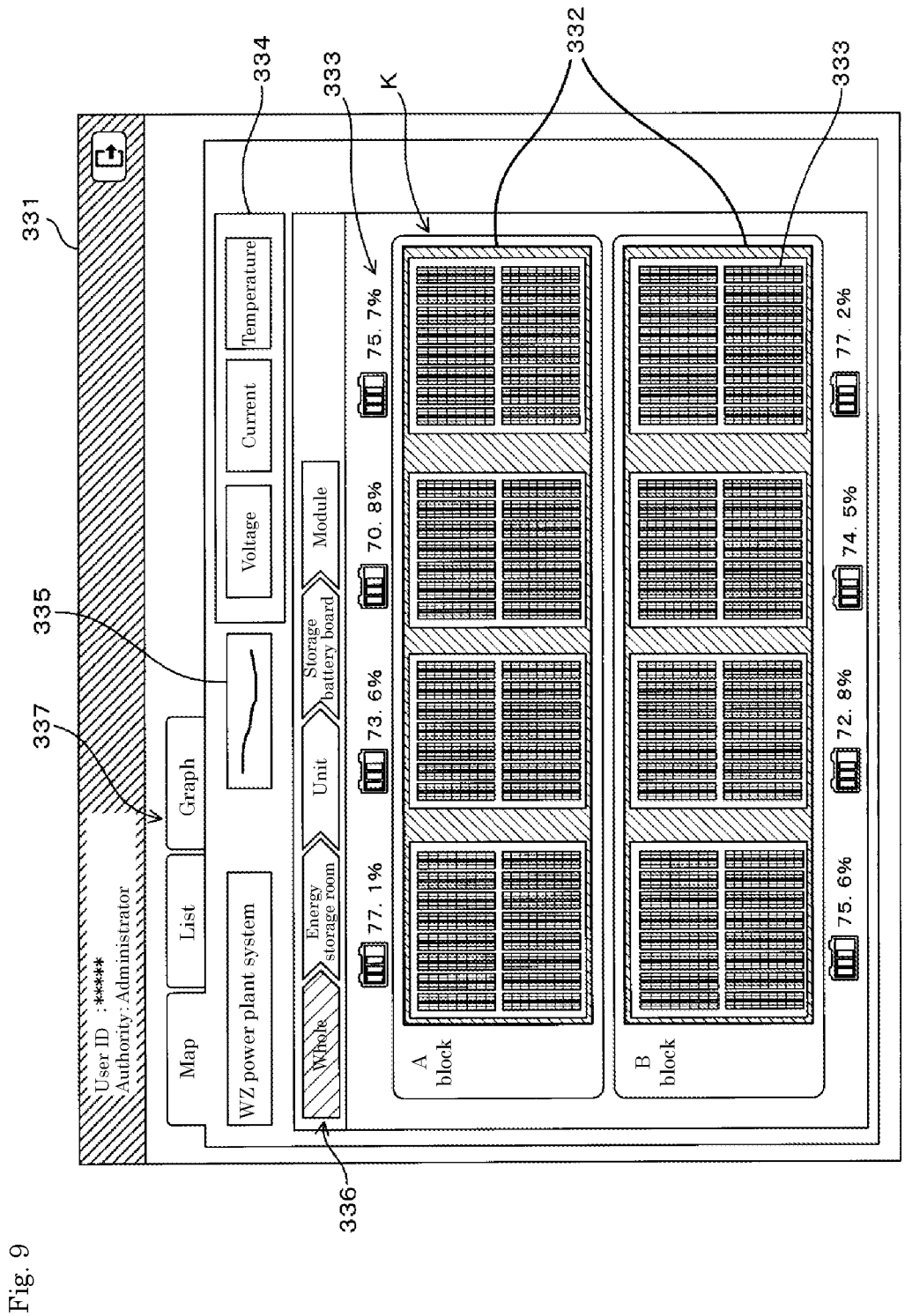
FIG. 9 is a diagram showing an example of a screen displayed based on screen information.

Next, a screen example in a case where a system or a device is selected will be described. FIG. 9 shows a state screen 331 showing the overall state of the selected system or device. The state screen 331 in FIG. 9 includes a layout image K (a diagram such as a CAD diagram, or a photograph) which is displayed when "WZ power plant system" in the list shown in FIG. 8 is selected by the operation of the operation unit 34 of the client device 3 and shows a large number of energy storage module groups in an arrangement state thereof. FIG. 9 shows the highest layer in screen transition (hierarchical structure) described later. In the example of FIG. 9, the layout image K of the entire eight energy storage rooms are shown. The layout image K in FIG. 9 shows a storage battery board in which three banks constituting the domain are stored in one small rectangle. The state screen 331 includes graphic objects 332, 333, and 335 that visually represent the state of "WZ power plant system" together with the layout image K.

The graphic object 332 is a graphic superimposed on the layout image K of the system and indicating states of the energy storage devices. The color or display form of the graphic object 332 may be different according to the state of the entire system on which the graphic object 332 is superimposed. The graphic object 332 may be superimposed on the entire system, may be superimposed for each minimum unit in the layout image K indicated by a small rectangle, or may be superimposed on an energy storage room or a block including a plurality of minimum units.

The state screen 331 includes a switching interface 334. In the example shown in FIG. 9, the switching interface 334 includes buttons or icons selectable for three types of "V (voltage)", "I (current)", and "T (temperature)". The "V (voltage)" may mean a cell voltage, and the "I (current)" may indicate a current flowing through the bank. The "T (temperature)" may indicate a module temperature. The graphic object 332 may display the presence or absence of an abnormal state and the degree of the abnormal state for the measurement value selected by the switching interface 334. By the operation of the switching interface 334, the states of different objects (V, I, T) are displayed using the same layout image K.

With such information presentation, the entire situation of the large-scale ESS including an enormous number of modules can be grasped by the layout image K and the graphic object 332. As will be described later, even if there is an abnormality in a module in any of the energy storage rooms of the energy storage system 101, by the graphic object 332 related to the entire energy storage system 101, in the uppermost layer, the state of each graphic corresponding to the module is not indicated. In the example of FIG. 9, whether or not the entire energy storage system 101 is in a sound state satisfying the capacity required for the system is shown.

The display position of the graphic object 332 is included in the design data of the state screen 331 in association with the image K according to the relative position with respect to the layout image K, and is stored in the storage unit 21. As a result, the graphic object 332 is appropriately moved according to the enlargement/reduction of the image K. The state screen 331 may include a switching interface for switching the image K between a CAD drawing (first image) and a photograph (second image).

The graphic object 333 is a second graphic indicating the SOC of the energy storage module group. The second graphic 333 may indicate an SOC (comprehensive SOC of a plurality of modules or banks) of an evaluation unit using a plurality of modules, a plurality of banks, or a plurality of domains as one evaluation unit. The color or display form of the second graphic 333 may be different according to the SOC value of the evaluation unit. The SOC value is calculated based on, for example, an SOC value calculated for each bank to which a plurality of modules are connected. The SOC value of the group including a plurality of banks is an average value obtained by dividing the total of the SOC values of the respective banks in the group by the number of banks included in the group. The number of banks included in the group may be the number of existing banks regardless of whether or not the banks are in operation, or the number of banks excluding the banks that are not in operation.

The SOC value of the group=Σ (bank SOC value)÷ the number of installed banks, or The SOC value of the group=Σ (bank SOC value)÷ number of operating banks.

The same average value is used for the SOC value in each layer of the unit including the plurality of groups, the energy storage room including the plurality of units, and the block including the plurality of energy storage rooms.

The graphic object 335 is a third graphic indicating the health condition of the system including the energy storage module group. As shown in FIG. 9, the third graphic 335 may be a trend graph in which the left side indicates old data and the right side indicates latest data. When the entire system is normal, the transition of the SOC may be graphed. The third graphic 335 may include a text indicating the number of units and the number of modules in operation. The third graphic 335 may include an image or a text indicating a storage capacity (discharge capacity) of the entire system.

The screen information of the state screen 331 shown in FIG. 9 includes a module, a bank, or a domain in the layout image K (that is, a selection target in the layout image K, which may be the same as the evaluation unit of the SOC), or a script for transitioning to the display of the state of the lower layer when the graphic object 332 or 333 is selected.

The state screen 331 may include a hierarchical menu 336 for selecting a layer of the energy storage system 101. The hierarchical menu 336 indicates a hierarchy of "Whole" corresponding to the uppermost layer, "Energy storage room" corresponding to layers of eight energy storage rooms constituting the entire energy storage system 101, "Unit" corresponding to each unit constituting the energy storage room, and "Storage battery board" corresponding to a plurality of banks constituting the unit. The displayed layer may be changed according to which one of "Whole", "Energy storage room", "Unit", and "Storage battery board" of the hierarchical menu 336 is selected. The hierarchical menu 336 may be used as a breadcrumb list.

The state screen 331 includes a display menu 337 for selecting a state display mode of the energy storage system 101. The display menu 337 includes selection tabs of "Map" for status display using the layout image K shown in FIG. 9, "List" for status display such as abnormality using a table, and "Graph" for status display using a graph. When "List" is selected, the automatic monitor 2P causes the display unit 33 to display a screen in FIG. 14 described later on the web browser. When "Graph" is selected, the automatic monitor 2P causes the display unit 33 to display a screen in FIG. 15 described later on the web browser.

Figure 10:
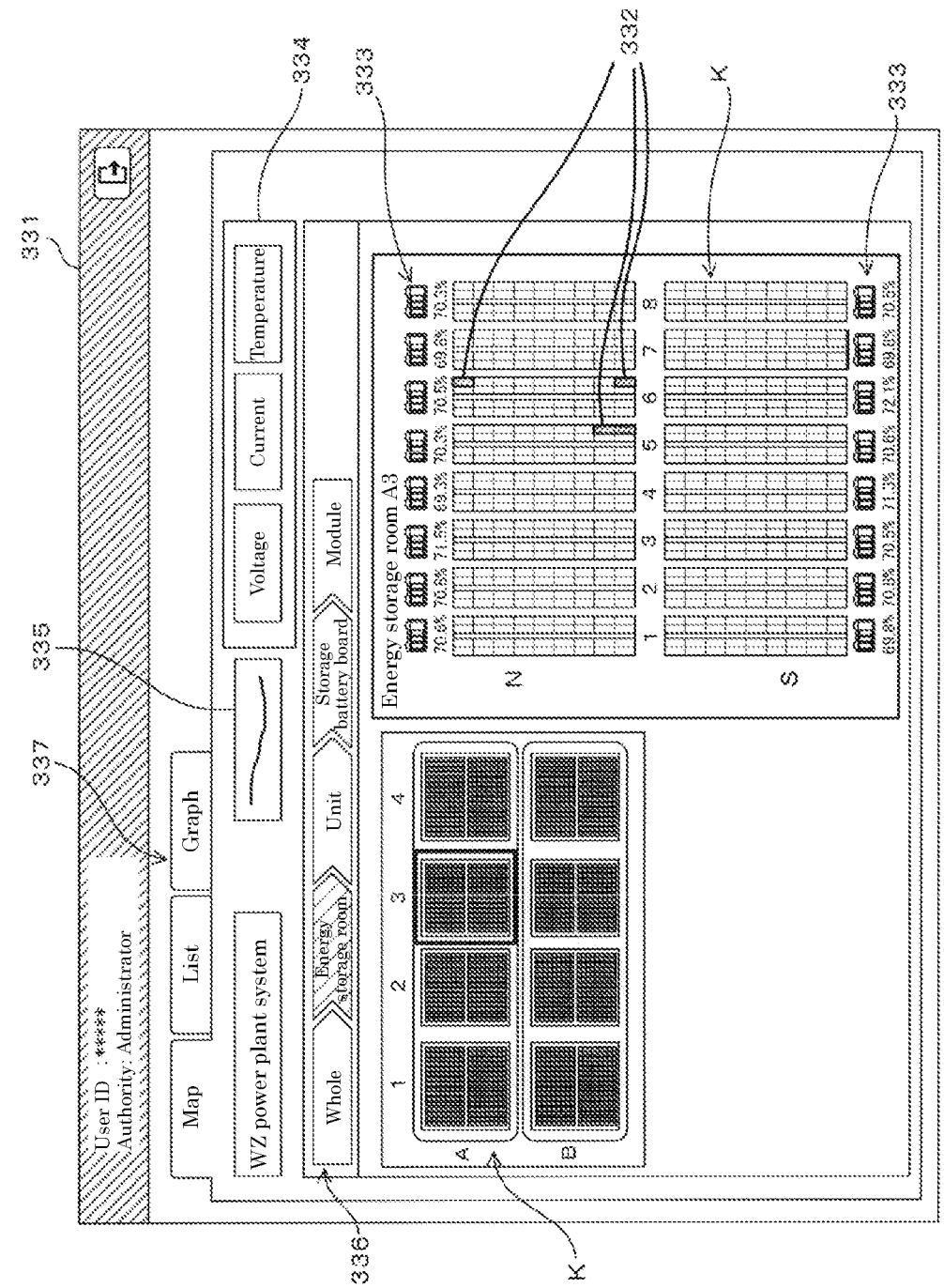
FIG. 10 is a diagram showing an example of a screen displayed based on screen information.

FIG. 10 is a diagram showing an example of the state screen 331 transitioning to a state display of another layer (intermediate layer). In FIG. 10, when a portion corresponding to any of the energy storage rooms (for example, a portion corresponding to the third energy storage room from the left of the A block) is selected on the layout image K shown in FIG. 9, the portion is displayed on the web browser by the automatic monitor 2P. In FIG. 10, an image obtained by reducing the entire layout image K of the upper layer before the transition is displayed on the left side of the screen, and a layout image K of the selected energy storage room is displayed on the right side. In the state screen 331 after the transition in FIG. 10, the position of the selected energy storage room on the entire map in the upper layer is indicated by the name assigned to the energy storage room and the emphasis on the reduced layout image K of the upper layer. In the example of FIG. 10, the position of the selected energy storage room is emphasized by a rectangular object on the layout image K of the upper layer. Alternatively, the position in the upper layer may be indicated by changing the color of the corresponding portion on the layout image K of the upper layer or superimposing an object.

In the example of FIG. 10, the state screen 331 after the transition shows the layout image K showing the energy storage module group L in units included in the energy storage room. In FIG. 10, a small rectangle corresponding to a minimum unit corresponds to a storage battery board that stores three banks. In the layers below the layer shown in FIG. 10, the color or display form of the first graphic 332 may be different for the module group L in an abnormal state according to the abnormality degree. The first graphic 332 may be superimposed on one small rectangle, may be superimposed on a plurality of small rectangles (for example, one unit), or may be superimposed on a plurality of banks (for example, one domain). In the state screen 331 after the screen transition shown in FIG. 10, an SOC of a finer evaluation unit than in the state screen before the transition (FIG. 9) may be displayed by the second graphic 333. That is, the range of the energy storage device whose state is indicated by the first graphic 332 and the second graphic 333 may be different between one state screen and the other state screen.

With such information presentation, for the large-scale ESS including an enormous number of modules, it is possible to cause the operator to determine what kind of treatment is required at which place and at what degree of urgency by the layout image K and the graphic object 332. The display unit 33 of the client device 3 has a large screen, which is suitable for use in which a plurality of operators simultaneously confirm a situation and make a decision.

Figure 11:
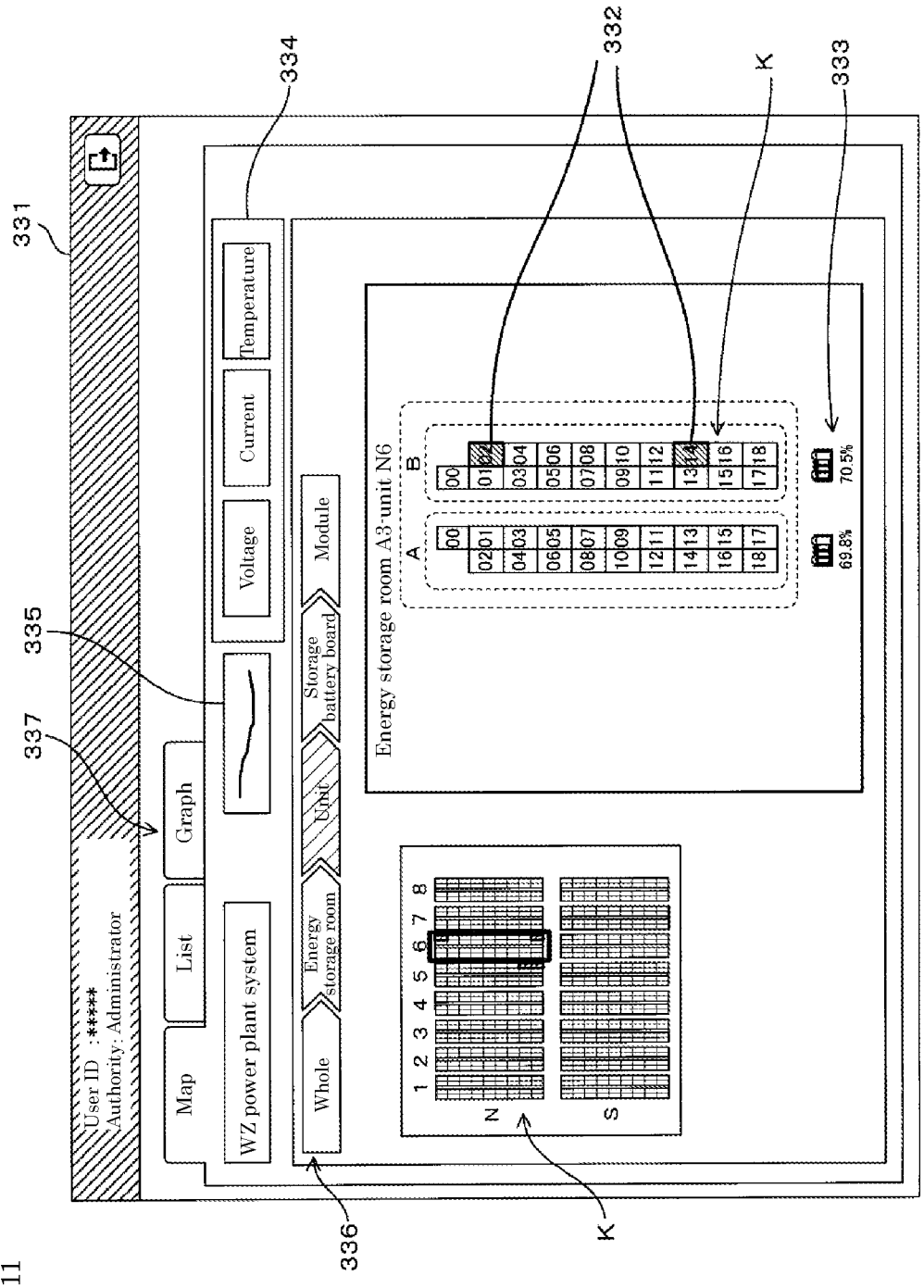
FIG. 11 is a diagram showing an example of a screen displayed based on screen information.

FIG. 11 is a diagram showing an example of the state screen 331 of still another layer. In FIG. 11, when a portion corresponding to any of the units is selected on the layout image K of the energy storage room shown in FIG. 10, the portion is displayed on the web browser by the automatic monitor 2P. A layout image K in FIG. 11 shows a layout of a unit selected from the layout image K of the energy storage room of the upper layer shown on the left side. The layout image K of the unit displays each of the storage battery boards in which the plurality of banks included in the selected unit are accommodated in a small rectangle. For the storage battery board including the bank in an abnormal state, the color or display form of the first graphic 332 superimposed on a small rectangle may be different according to the abnormality degree.

Figure 12:
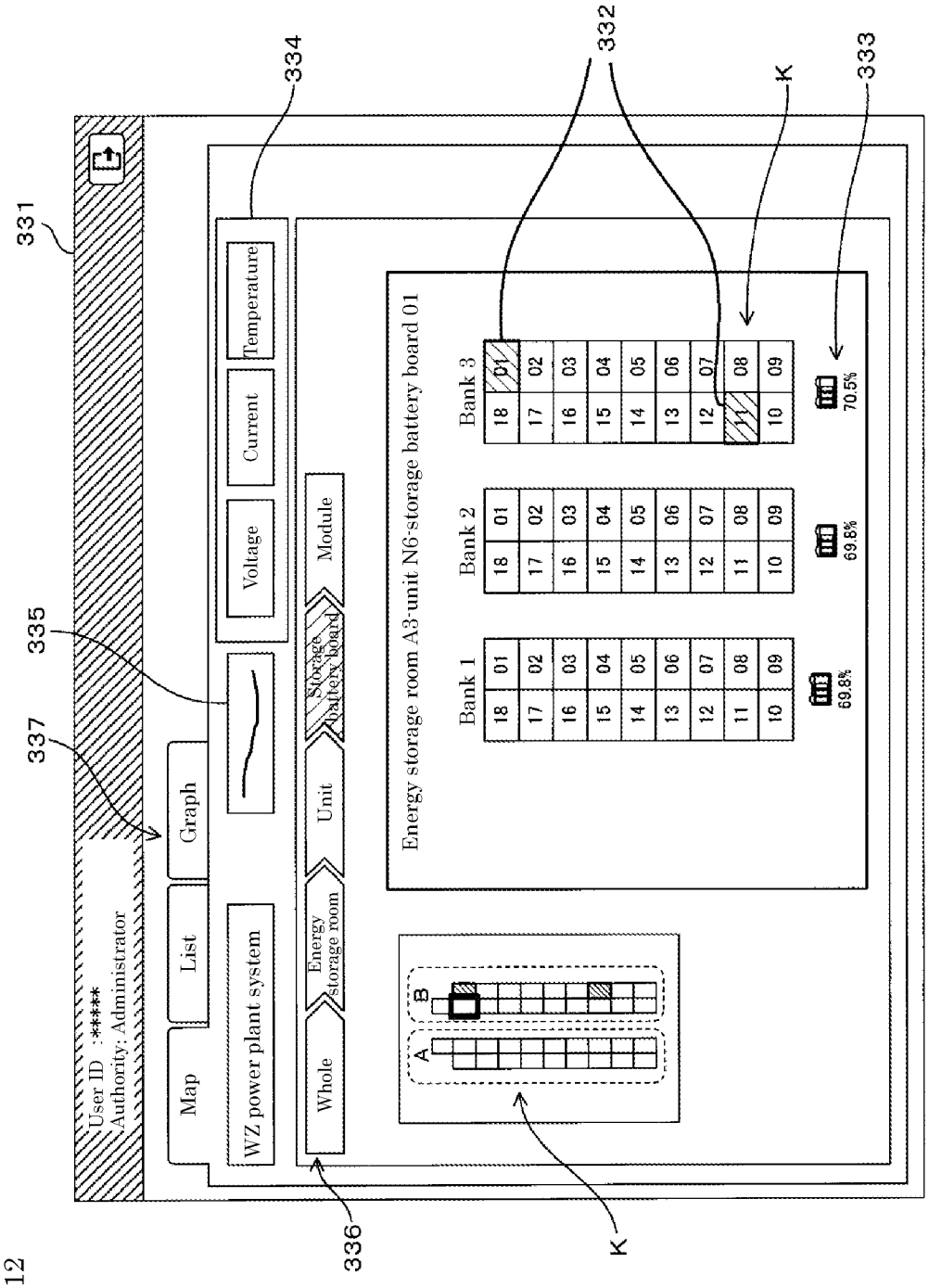
FIG. 12 is a diagram showing an example of a screen displayed based on screen information.

FIG. 12 is a diagram showing an example of the state screen 331 of still another layer. In FIG. 12, when a portion corresponding to any of the storage battery boards is selected on the layout image K of the unit shown in FIG. 11, the portion is displayed on the web browser by the automatic monitor 2P. A layout image K in FIG. 12 shows the banks included in the storage battery board selected from the layout image K of the unit of the upper layer shown on the left side and the layout of the modules constituting the banks. The layout image K of the storage battery board displays each of the modules in the plurality of banks included in the selected storage battery board in a small rectangle. For the module in an abnormal state, the color or display form of the first graphic 332 superimposed on a small rectangle may be different according to the abnormality degree.

Figure 13:
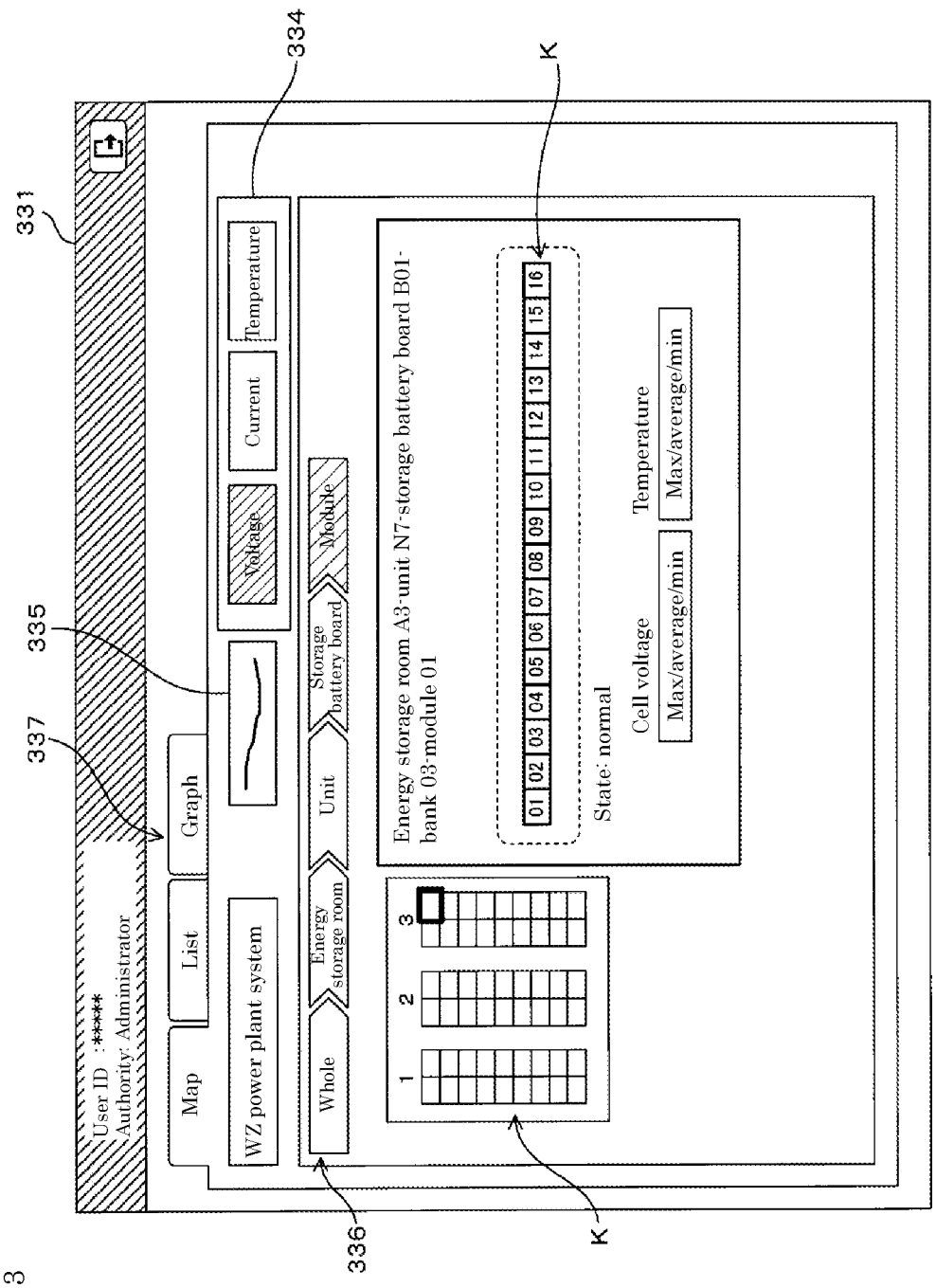
FIG. 13 is a diagram showing an example of a screen displayed based on screen information.

FIG. 13 is a diagram showing an example of the state screen 331 of still another layer. In FIG. 13, when a portion corresponding to any of the modules is selected on the layout image K of the banks and the modules shown in FIG. 12, the portion is displayed on the web browser by the automatic monitor 2P. A layout image K in FIG. 13 shows the layout of the cells included in the module selected from the layout image K of the banks and the modules of the upper layer shown on the left side. The layout image K of the cells displays a state of each of a plurality of cells included in the selected module. For the cell in an abnormal state, the color or display form of the first graphic 332 may be different according to the abnormality degree.

Since the state screen 331 shown in FIG. 13 shows the states of the cells corresponding to the lowermost layer of the configuration of the energy storage system 101, the state of each cell may be indicated by text such as "Normal" or "Abnormal", and the cell voltage or temperature may be indicated by text. In the above description, the minimum unit of display in the configuration of the energy storage system 101 is each cell of "Module", but the present invention is not limited thereto. In another example, the minimum unit of display may be each module of "Storage battery board". In this case, in the screen shown in FIG. 12, for each bank, the SOC may be indicated by the second graphic 333, and the average value of the cell voltage, the temperature, and the current value in the bank may be indicated by text.

The transition from the state screen 331 shown in FIG. 9 to the state screens 331 in FIGS. 10, 11, 12, and 13 may be displayed such that the layout image K in the layer appears while the layout image K in the upper layer is reduced like an animation.

Figure 14:
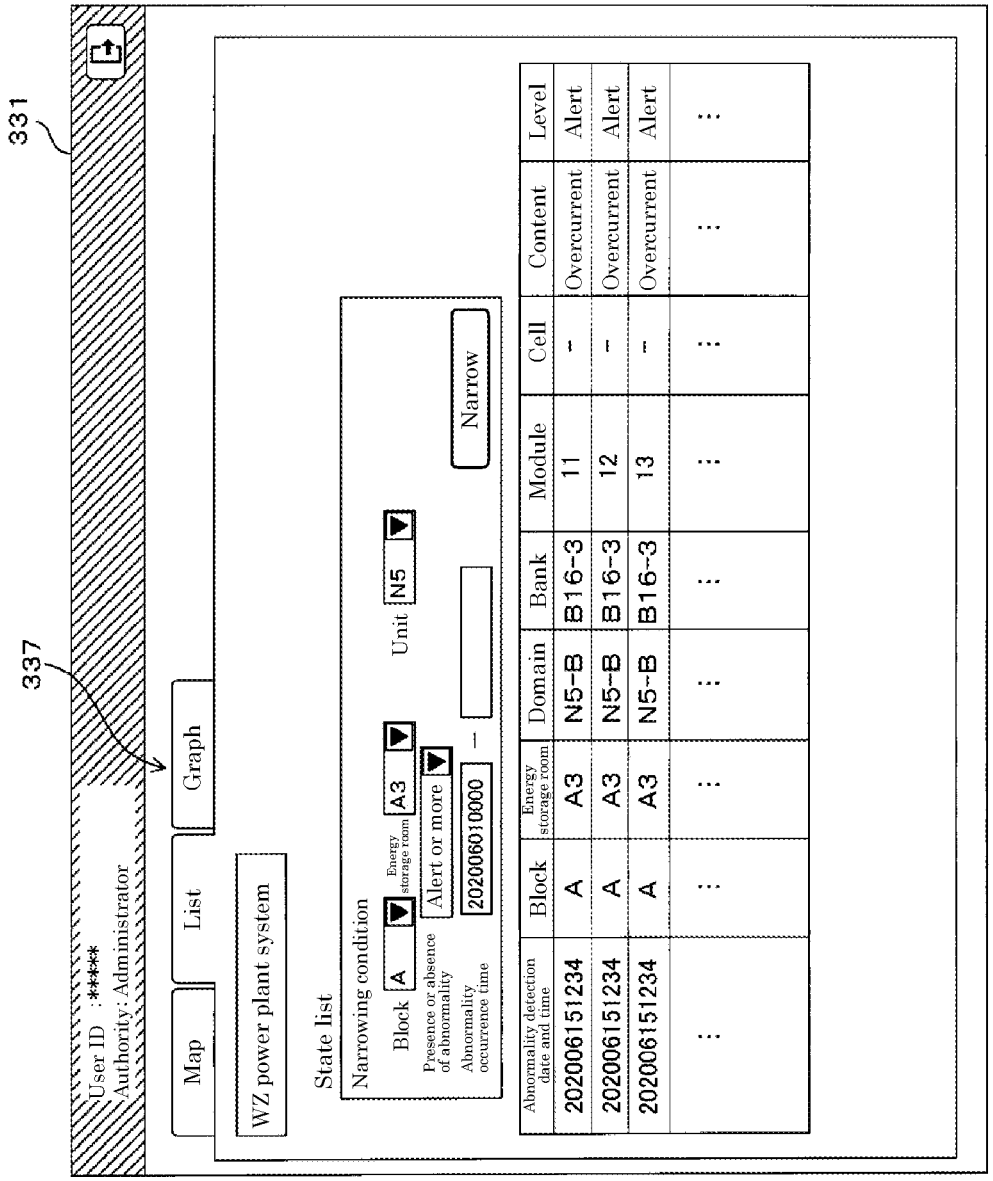
FIG. 14 is a diagram showing an example of a screen displayed based on screen information.

FIG. 14 is a diagram showing an example of a case where "List" is selected in the display menu 337 of the state screen 331. The state screen 331 in FIG. 14 displays a list of states including Normal by text in units of domain, bank, module, or cell included in the energy storage system 101. In the example shown in FIG. 14, only the states of the domains, banks, modules, or cells in which an abnormality is detected are displayed. As shown in FIG. 14, the display target may be narrowed down by a unit, an energy storage room, or a block to which a domain, a bank, a module, or a cell of the display target of the state belongs.

Figure 15:
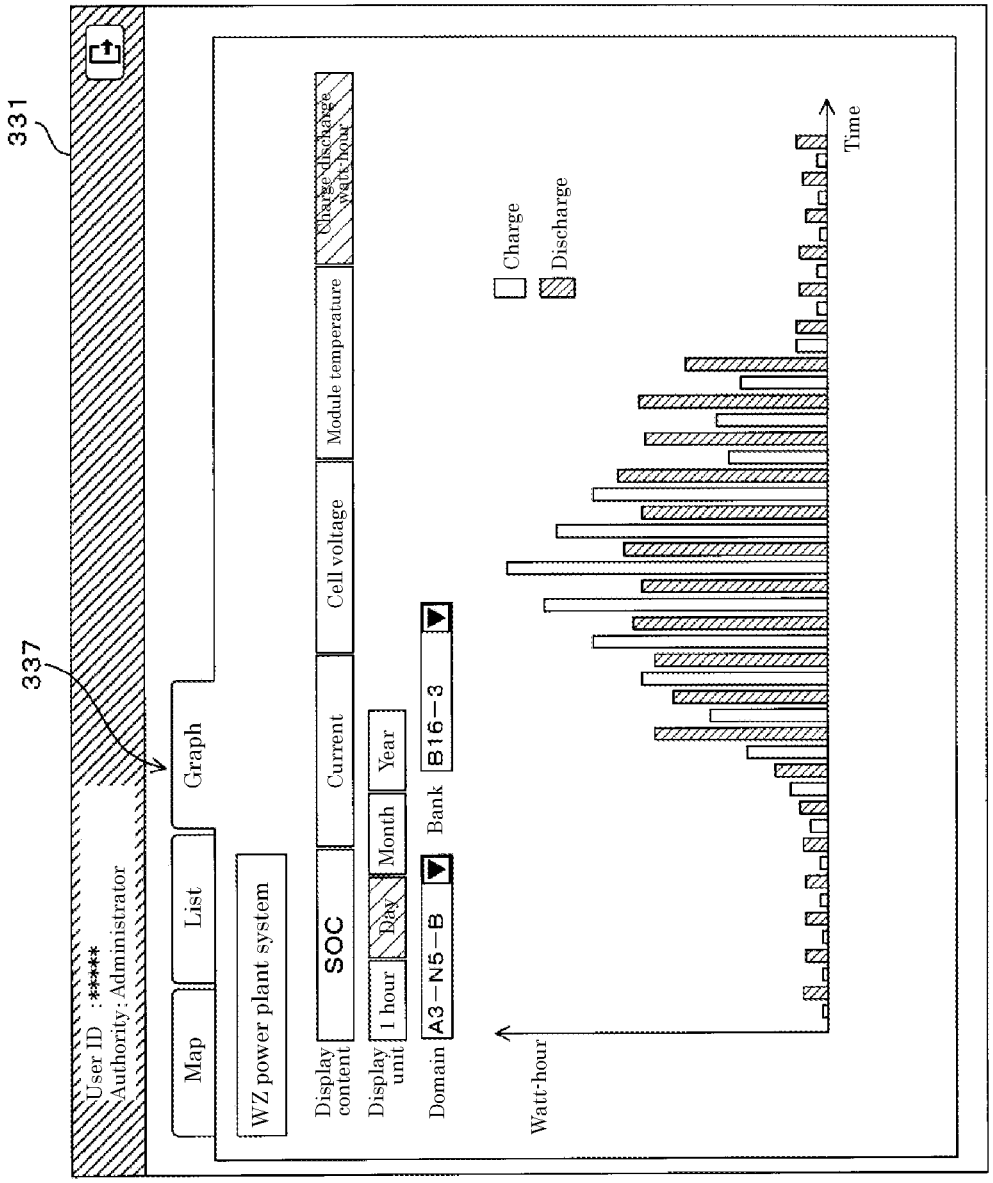
FIG. 15 is a diagram showing an example of a screen displayed based on screen information.

FIG. 15 is a diagram showing an example of a case where "Graph" is selected in the display menu 337 of the state screen 331. The state screen 331 in FIG. 15 displays a temporal change of the state of the energy storage system 101 by a graph in units of domain, bank, or module included in the energy storage system 101. In the example of FIG. 15, a graph of the time distribution of the discharge watt-hour and the charge watt-hour per day in the selected bank is displayed. When an SOC, a current, a cell voltage, or a module temperature is selected in addition to the charge-discharge watt-hour, the automatic monitor 2P displays a time change of the SOC, the current, the cell voltage, or the module temperature in a time unit of second, day, month, or year while sequentially updating the time change by a line graph. As a result, the client device 3 can display the state of the energy storage device in detail in units of domain, bank, and module while indicating whether the performance required for the entire energy storage system 101 is exhibited by the object in the map display.

Figure 16:
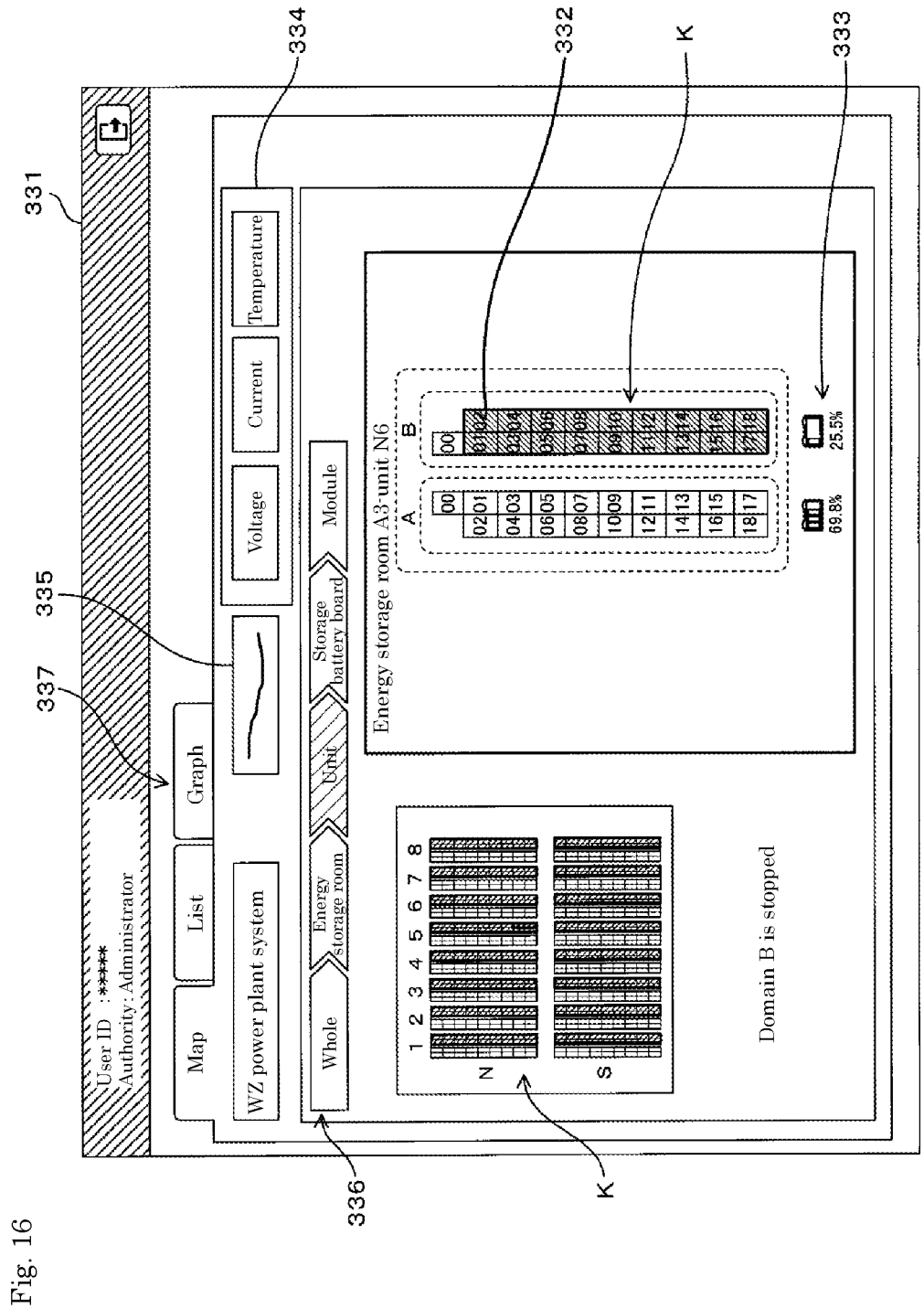
FIG. 16 is a diagram showing an example of a screen displayed based on screen information.

FIG. 16 is a diagram showing an example of the state screen 311. FIG. 16 shows another example of the state screen 311 showing the state of the unit in FIG. 11. The state screen 311 in FIG. 16 shows a state in which an operation is performed while modules included in a domain of B among A and B of each unit constituting the energy storage system 101 are stopped. The state screen 311 in FIG. 16 is different from the state screen 311 in FIG. 11 in that the first graphic 322 is superimposed over the entire domain B of the unit shown in the layout image K. The first graphic 322 is a color or display form corresponding to being stopped. The state screen 311 in FIG. 16 includes a text indicating that the domain B of the unit is stopped. The automatic monitor 2P may indicate that the server device 2 can detect that the domain B is stopped but the operation is performed normally by text.

In the state screen 311 in FIG. 16, the first graphic 322 indicates that the domain B of each of 16 units disposed in the energy storage room is stopped, but the domain B is not abnormal but is stopped. In a case where the entire state is displayed in this case, the automatic monitor 2P indicates that the system is operating as a whole without abnormality on the state screen 311 as shown in FIG. 9. The first graphic 322 is not a color or display form corresponding to that a part of the system is stopped but a color or a display form corresponding to that the system is normal. As a result, even when any of the modules of the energy storage system 101 is stopped, the state screen 311 can indicate whether or not the system is in a sound state satisfying the capacity required for the system.

The above-described embodiment is illustrative and not restrictive. The scope of the present invention is defined by the claims, and is intended to include meanings equivalent to the claims and all modifications within the scope.

The invention claimed is:

1. An information processing device comprising:
an acquisition unit configured to acquire information including a state of an energy storage device by communication at predetermined time intervals;
a storage processing unit configured to store the acquired information in a storage medium in association with information for identifying the energy storage device;
a transmission processing unit configured to transmit screen information of a state screen including a layout image of a system including the energy storage device and a graphic indicating the state of the energy storage device to a communication terminal device; and
an automatic monitor unit configured to update information of the graphic based on latest information stored in the storage medium and periodically transmit the information of the graphic to the communication terminal device,
wherein the graphic includes a first graphic indicating a state of a cell, a module, a bank, or a plurality of banks of the energy storage device, the first graphic being superimposed on a position where the energy storage device is drawn in the layout image of the system including the energy storage device.

2. The information processing device according to claim 1, wherein:
the screen information is created corresponding to a plurality of state screens in which ranges of the energy storage devices to be displayed are hierarchically different from each other, and
in the graphic, the range of the energy storage device whose state is indicated by the graphic differs between one state screen and another state screen.

3. The information processing device according to claim 1, wherein the first graphic further indicates a state of at least one of a voltage, a current, and a temperature of the cell, the module, the bank, or the plurality of banks of the energy storage device.

4. The information processing device according to claim 3, wherein the state screen includes a switching interface for selecting an object whose state is displayed by the first graphic from a voltage, a current, or a temperature.

5. The information processing device according to claim 1, wherein the graphic further includes a second graphic indicating a state of charge of a cell, a module, a bank, or a plurality of banks of the energy storage device.

6. The information processing device according to claim 5, wherein the state of charge by the second graphic is matched with a state of charge output from a power conditioner connected to the energy storage device.

7. The information processing device according to claim 5, wherein the graphic further includes a third graphic indicating a health condition of the entire system.

8. An information processing system comprising:
   a plurality of communication devices connected to or mounted on an energy storage device; and
   an information processing device capable of establishing communication connection with the plurality of communication devices,
   the information processing device comprising:
      an acquisition unit configured to acquire information including a state of the energy storage device by communication at predetermined time intervals;
      a storage processing unit configured to store the acquired information in a storage medium in association with information for identifying the energy storage device;
      a transmission processing unit configured to transmit screen information of a state screen including a layout image of a system including the energy storage device and a graphic indicating the state of the energy storage device to a communication terminal device; and
      an automatic monitor unit configured to update information of the graphic based on latest information stored in the storage medium and periodically transmit the information of the graphic to the communication terminal device,
      wherein the graphic includes a first graphic indicating a state of a cell, a module, a bank, or a plurality of banks of the energy storage device, the first graphic being superimposed on a position where the energy storage device is drawn in the layout image of the system including the energy storage device.

9. An information processing method in which an information processing device transmits information of an energy storage device in response to a request or as an event, the method comprising:
   acquiring information including a state of the energy storage device by communication using a communication device connected to or mounted on the energy storage device;
   storing the acquired information in a storage medium in association with information for identifying the energy storage device;
   transmitting screen information of a state screen including a layout image of a system including the energy storage device and a graphic indicating the state of the energy storage device to a communication terminal device, wherein the graphic includes a first graphic indicating a state of a cell, a module, a bank, or a plurality of banks of the energy storage device, the first graphic being superimposed on a position where the energy storage device is drawn in the layout image of the system including the energy storage device; and
   updating information of the graphic based on latest information stored in the storage medium and periodically transmitting the information of the graphic to the communication terminal device.

10. A computer program for causing a computer including a display unit to display information of an energy storage device, the computer program causing the computer to execute:
   a step of requesting information of the energy storage device for each system including the energy storage device or each place where the energy storage device is installed;
   a step of displaying a state screen on the display unit based on screen information of the state screen including a layout image of a system including the energy storage device and a graphic indicating a state of the energy storage device, the screen information being transmitted in response to a request, wherein the graphic includes a first graphic indicating a state of a cell, a module, a bank, or a plurality of banks of the energy storage device, the first graphic being superimposed on a position where the energy storage device is drawn in the layout image of the system including the energy storage device; and
   a step of displaying the updated state screen on the display unit based on updated information of the graphic that is periodically transmitted.

\* \* \* \* \*